US010325861B2

(12) United States Patent
Miccoli

(10) Patent No.: US 10,325,861 B2
(45) Date of Patent: Jun. 18, 2019

(54) METHODS AND STRUCTURES FOR DICING INTEGRATED CIRCUITS FROM A WAFER

(71) Applicant: Intel IP Corporation, Santa Clara, CA (US)

(72) Inventor: Giuseppe Miccoli, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/283,143

(22) Filed: Sep. 30, 2016

(65) Prior Publication Data

US 2018/0096952 A1 Apr. 5, 2018

(51) Int. Cl.
*H01L 23/544* (2006.01)
*H01L 21/304* (2006.01)
*H01L 21/78* (2006.01)
*H01L 21/311* (2006.01)
(Continued)

(52) U.S. Cl.
CPC .......... *H01L 23/562* (2013.01); *H01L 21/304* (2013.01); *H01L 21/31111* (2013.01); *H01L 21/32134* (2013.01); *H01L 21/78* (2013.01); *H01L 23/544* (2013.01); *H01L 23/564* (2013.01); *H01L 2223/5446* (2013.01)

(58) Field of Classification Search
CPC ............. H01L 23/562; H01L 21/31111; H01L 21/32134; H01L 21/78; H01L 21/304; H01L 23/544; H01L 23/564; H01L 2223/5446; H01L 23/502; H01L 21/3134
See application file for complete search history.

(56) References Cited

U.S. PATENT DOCUMENTS 7,482,251 B1 * 1/2009 Paulsen ................... H01L 21/78
257/E21.237
8,680,653 B2   3/2014 Miccoli et al.
8,809,120 B2   8/2014 Miccoli et al.
(Continued)

FOREIGN PATENT DOCUMENTS

WO    WO-2015-121198    8/2015

OTHER PUBLICATIONS

Gambino, Jeffrey P., et al., "An Overview of Through-Silicon-Via Technology and Manufacturing Challenges", *Microelectronic Engineering* 135 (2015), 73-106.
(Continued)

*Primary Examiner* — Caridad Everhart
(74) *Attorney, Agent, or Firm* — Schwabe, Williamson & Wyatt, P.C.

(57) ABSTRACT

Dicing a semiconductor wafer into chips may include (and structures may result from) forming a lateral chip dicing pattern of vertical metal stack kerf (MSK) structures from a depth below an upper surface of a substrate of a wafer, up through metallization layers of the wafer, to a top surface of the wafer. This dicing pattern may separate or define the perimeters/edges of the chips to be diced. A protective layer over the wafer can be etched to form a pattern of openings to the pattern of MSK structures. Then, a wet etch through the pattern of openings in the protective layer removes the MSK structures and forms lateral chip dicing trench pattern to the depth below the upper surface of the substrate along the intended lateral dicing pattern. A bottom surface of the substrate can be ground to expose the bottom of the trench pattern and dice the chips.

18 Claims, 15 Drawing Sheets

(51) Int. Cl.
*H01L 23/00* (2006.01)
*H01L 21/3213* (2006.01)

(56) References Cited

U.S. PATENT DOCUMENTS

| | | | |
|---|---|---|---|
| 2005/0116333 A1* | 6/2005 | Akiyama | H01L 23/53295 257/698 |
| 2006/0001144 A1 | 1/2006 | Uehling et al. | |
| 2006/0019467 A1* | 1/2006 | Lee | H01L 21/78 438/462 |
| 2007/0045799 A1* | 3/2007 | Sekiya | H01L 21/67132 257/678 |
| 2009/0121321 A1* | 5/2009 | Miccoli | G03F 7/70625 257/618 |
| 2010/0210043 A1* | 8/2010 | Liu | H01L 22/34 438/17 |
| 2016/0240439 A1* | 8/2016 | Yu | H01L 21/78 |
| 2016/0260674 A1* | 9/2016 | Jones | H01L 21/76898 |
| 2017/0062277 A1* | 3/2017 | Schrems | H01L 21/76898 |

OTHER PUBLICATIONS

Zheng, Xu, et al., "Through-Silicon-Via Fabrication Technologies, Passives Extraction, and Electrical Modeling for 3-D Integration/Packaging", *IEEE Transactions on Semiconductor Manufacturing*, vol. 26, No. 1, (Feb. 2013), 23-34.
International Search Report and Written Opinion for International Application No. PCT/US2017/048922 dated Feb. 25, 2019, 16 pgs.
International Preliminary Report on Patentability for International Patent Application No. PCT/US17/48922, dated Apr. 11, 2019, 12 pages.

* cited by examiner (a) Before Expansion    (b) After Expansion

METHODS AND STRUCTURES FOR DICING
INTEGRATED CIRCUITS FROM A WAFER

BACKGROUND

Field

Embodiments of the invention are related in general, to methods and structures for dicing integrated circuits (e.g., integrated circuit (IC) "chips" or "die") from wafers (e.g., silicon semiconductor wafers). Such methods and structures may include those used for wet etching a lateral chip dicing pattern of a stack of metallization layer, via layer and through silicon via structures extending through a metallization layer and into a thickness of the substrate of the wafer; then grinding a lower surface of the substrate

Description of Related Art

Integrated circuit (IC) chips (e.g., "chips", "dies", "ICs" or "IC chips"), such as microprocessors, coprocessors, graphics processors, memories and other microelectronic devices are often formed across (on or within) the surface a large "wafer" of semiconductor material, such as a wafer of silicon, silicon germanium, germanium, or the like. After formation, the wafer is "diced" to separate or "singulate" the integrated circuit (IC) chips or "die" from each other. Once they are diced, each chip or "die" can be picked up and separately packaged, mounted or used in an electronic device

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Figure 1A:
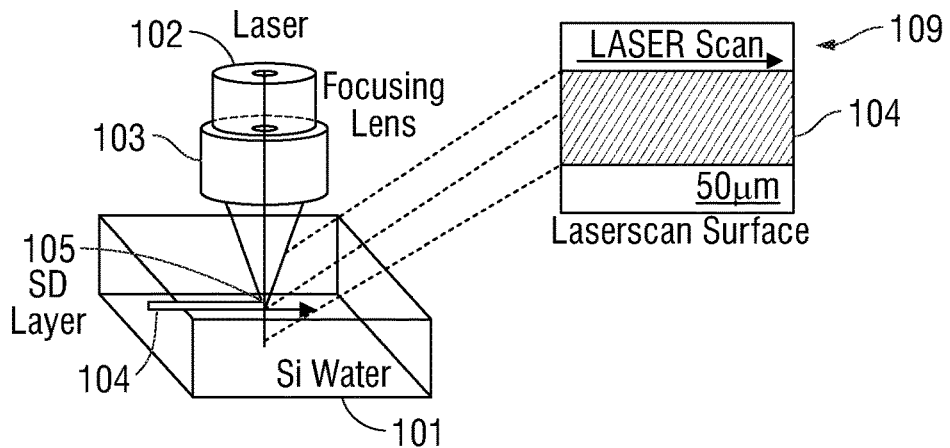
FIGS. 1A-1C, illustrate the principle of the stealth dicing technology for dicing integrated circuit (IC) chip "die" from a wafer.

Several embodiments of the invention with reference to the appended drawings are now explained. Whenever the shapes, relative positions and other aspects of the parts described in the embodiments are not clearly defined, the scope of embodiments of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

During formation or processing of a wafer, the semiconductor integrated circuits (or devices, or chips) that are manufactured on the wafer typically need to be kept apart from each other by a given distance. This distance may be a horizontal distance between vertical edges or seal rings of adjacent chips. This distance may be called a "dicing street", "scribe-line", "kerf" (e.g., a "kerf line region"), "dicing channel", etc. When the wafer is diced to separate the chips, the parts of the wafer in these distances is typically destroyed, removed or otherwise not existing or included as part of the separated chips.

In some cases, this distance is needed so that the singulation process that can be based on a disruptive mechanical sawing or a laser process can be performed within the kerf to separate the chips, without damaging the circuits on the chips. The sawing process is normally conducted by means of a rotating diamond circular blade. In recent times, a prescribing process assisted by an ablation laser is utilized. The kerf, which surrounds each chip on its four sides, has a width which varies from technology to technology. By making use of conventional blade dicing and taking into account the stringent manufacturing quality and reliability requirements of today's mass production standards (e.g., zero defect policies), the narrowest available kerf released in production appears can be up to 120 micrometers (um) wide.

The area required for the kerf is typically destroyed during the dicing process, such as by being sawn or ground to dust; or being melted or evaporated. For this reason, temporary structures may often be found in the kerf area. For example, within the space of the kerf, a number of structures necessary to control the manufacturing operations may be placed. Such structures comprise the typical process control monitors (PCM) (e.g., electrical test structures to confirm processing is succeeding as expected), the photolithographic alignment structures, the wafer level reliability test circuits, the film thickness and critical dimension (CD) measurement structures, etc. When the mechanical rotating blade-assisted dicing operation is performed, the wafer state of the kerf is wasted and mentioned test structures are destroyed. The width of the kerf may be determined by the following factors: the width of the dicing blade, the width of the test and measurement structures plus margins for quality and reliability concerns.

When making use of mechanical rotating blade-assisted dicing, the following observations can typically be made: the smaller the area of the chip, the higher the percentage of wafer material wasted in the kerf; the edges of the singulated die are particularly rough and there is a high risk of chipping of the upper films of the chip; micro-cracks can be easily generated which propagate within the integrated circuit (which can pose reliability constraints), consequently, the integrated circuit has to be protected from crack issues by means of "crack stop" structures, which, in turn, increase the chip area; generation of wafer dust (generally silicon) that can lead to discoloration/corrosion of the input/output circuit pads (generally made of aluminum); the utilization of water, intended to cool down the blade and wash out the dirt, can lead to corrosion of the aluminum of the pad; and the dicing has to be performed along perpendicular and/or rectangular kerf lines.

During the last few years, a new sawing/dicing technology has emerged in the industry, known as "Stealth Dicing", which relies on a laser beam to perform the singulation of the dies. The main characteristic of such a stealth dicing technology is that the laser beam is focused at a selectable depth within the bulk of the wafer. The energy carried by the laser beam is therefore capable of locally modifying the morphology of the crystalline wafer (e.g., silicon, GaAs, etc.) from mono-crystalline to poly-crystalline. As a result, a precisely localized line of mechanical stress is introduced within the bulk of the wafer at the selected depth. Once the wafer has been processed through the stealth dicing tool, it is still not yet singulated. In order to separate each die from its neighbor, it is necessary to apply a controlled mechanical expansion of the wafer; such an operation is performed in a separate module of the stealth dicing machine called expander.

Figure 1B:
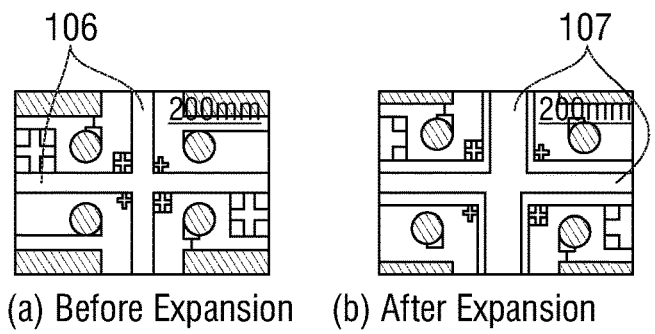
Figure 1C:
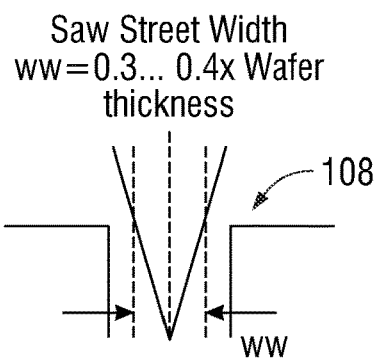

FIGS. 1A-C show an example of a stealth dicing tool and process that may be used to dice a wafer into chips. FIG. 1A shows how a laser beam 102 may be focused by means of a focusing lens 103 so that the focal point 104 is at a selected depth (SD) 105 within the bulk of a silicon wafer 101. The laser beam may be moved across the silicon wafer to form an elongated modified wafer region. In FIG. 1A the laser is moved from the left to the right as indicated by the dotted arrow. Thus, the modified wafer region has been created to the left of the focal point of the laser beam and is about to be created to the right of the focal point of the laser beam. The laser may be operated in a continuous manner, but typically the laser is pulsed so that short laser pulses interact with the silicon of the wafer in the vicinity of the focal point. An inset to the right in FIG. 1A shows a laser scan surface resulting 109 from focusing the laser beam at the selectable depth within the bulk of the silicon wafer and moving the laser beam in the indicated direction (arrow labeled "LASER scan"). It can be seen that a relatively well-defined modified region can be obtained while the surrounding silicon material is substantially unaltered.

FIG. 1B shows a top view of an intersection of two scribe-lines or kerfs before and after expanding the wafer. FIG. 1B shows more narrow scribe-lines or kerfs 106 before expanding the wafer. FIG. 1B shows relatively wider scribe-lines or kerfs 107 after expanding the wafer.

FIG. 1C shows a schematic cross-section through a kerf region 108 after the wafer has been expanded. The saw street or scribe-line width (ww) can be empirically estimated with the formula ww=0.30×(Wafer thickness) to w=0.40×(Wafer thickness). Therefore, if a wafer, as thick as 300 micrometers ("um"), needs to be stealth diced by irradiating it from the top surface, ww has to be in the range of 90-120 um. In order to avoid undesired refraction or reflection of a laser beam, this minimum width (ww) has to be kept normally free from materials other than silicon/silicon dioxide.

Focusing the laser beam into the silicon wafer predetermines a breaking line. In this case, the actual singulation is then caused by subsequent tape expansion supported by a breaking tool. Multiple passes of the laser beam focused at different depths within the bulk of the wafer will induce a well-controlled and accurately positioned stack of stress-lines one on top of the other. It can be appreciated that this process can be performed on one wafer at a time and can take a great deal of laser energy and time to predetermines all of the breaking lines of all of the chips of a single wafer.

However, there is a need in the field for an inexpensive and high throughput process for dicing IC chips from wafers that can: dice chips of any shape, singulate every single die in a shared reticle, improve the quality of the singulated die, minimize costs to singulate the die of wafers, drastically reduce scribe-line width when dicing wafers, and increase throughput of dicing wafers. This is especially needed in modern chip production in order to maximize the silicon utilization of semiconductor wafers so that the wafer can accommodate a maximum possible number of chips. This is especially relevant for flash or smart power products, logic products, memory products, etc. Some embodiments of the invention include methods and structures for dicing integrated circuits from a wafer including by wet etching a lateral chip dicing pattern of metallization layer, via layer and through silicon via structures extending through a metallization layer and into a thickness of the substrate of the wafer; then grinding a lower surface of the substrate Some embodiments according to the invention are related to a method of dicing a semiconductor wafer (e.g., see FIGS. 3A-H). Some embodiments according to the invention are related to a wafer as an intermediate product (e.g., and structures for) during the method of dicing the wafer (e.g., see FIGS. 3A-H). Some embodiments according to the invention are related to a semiconductor device (e.g., and structures for) obtained from the method of dicing a wafer (e.g., see FIGS. 3A-H).

According to some embodiments, a chemical wet etching process may be used to form a deep (e.g., from a few tens up to 100 um through the top and into the substrate below the devices of the wafer) and narrow (e.g., few microns) groove around the sides of the integrated circuits (dice) placed on a semiconductor wafer, by etching a lateral chip dicing pattern of metallization layer, via layer and through silicon via structures of conductor, alloy, and/or metal, such as a stack of conductive (e.g., conductor material) metal stack Kerf (MSK) structures. By having the formation of said groove followed by a standard wafer backside grinding, the dicing (or singulation) of each die can be performed.

In some cases, said lateral chip dicing pattern of deep and narrow groove or trench can be formed by exploiting a chemical wet etch of the physically continuous stack of metal(s) of the lateral chip dicing pattern of MSK structures including levels which are formed during the normal wafer processing processes (e.g., a wet etch of the lateral chip dicing pattern of MSKs).

In some cases, such a lateral chip dicing pattern of metal MSK structures surround each die on all of its sides and is built by integrating metallization layer, via layer and through silicon via technology (e.g., used here to also form the part of the metal stack in the bulk of the semiconductor wafer) to form the pattern to a thickness (e.g., height or depth) "t" below surface 212 of the wafer. In some cases this is done with a normal dual damascene process integration scheme.

In some cases, surrounding each die on all of its sides with the lateral chip dicing pattern (e.g., of pattern 134 MSK structures 150; or pattern 334 of trenches 350) is "completely surrounding" each die so that a beginning horizontal location of a lateral chip dicing pattern of MSK structures completely surrounding a die extends around a horizontal area of the die and physically attaches to or touches an ending horizontal location of the same MSK structures at a horizontal location of or on the die. In some cases, this metallization layer, via layer and through silicon via structure pattern technology is added to the metallization layer, via layer and through silicon via (TSV) processing already being performed on parts of the chips 120a-b. In some cases, this metallization layer and via layer and through silicon via pattern technology for MSK structures (e.g., MSKs 154-176) is part of the processing processes (e.g., in addition to the already expected or prior metallization layer and via layer structures but formed during the same processing) so only minimal additional processing (e.g., for TSV structures 152) is required as the TSV processing already being performed on parts of the chips 120a-b to form stack 220.

In some cases, such a wet etch shall be based on a properly calibrated $H_2SO_4$: $H_2O_2$: and/or $H_2O$ (e.g., a so-called "Piranha Etch" due to the typical "bubbling" of the hot solution used to perform the etch simulating a feeding school of Piranha fish) solution. Etch rate of metals (or alloys) (e.g., Al, Ag, Au, Ti, Cu, W, TiN, TaN, etc.) typically adopted in semiconductor technology are pretty high whereas etch rate of dielectrics are very slow; therefore, high etch selectivity of metal of the lateral chip dicing pattern of MSK structures 150 to dielectric 222 and 224 and of substrate 210 is expected. In some cases, critical factors to optimize the performance of the Piranha wet etch of metals are expected to be the etch temperature and the relative concentrations of the constituents.

Figure 2A:
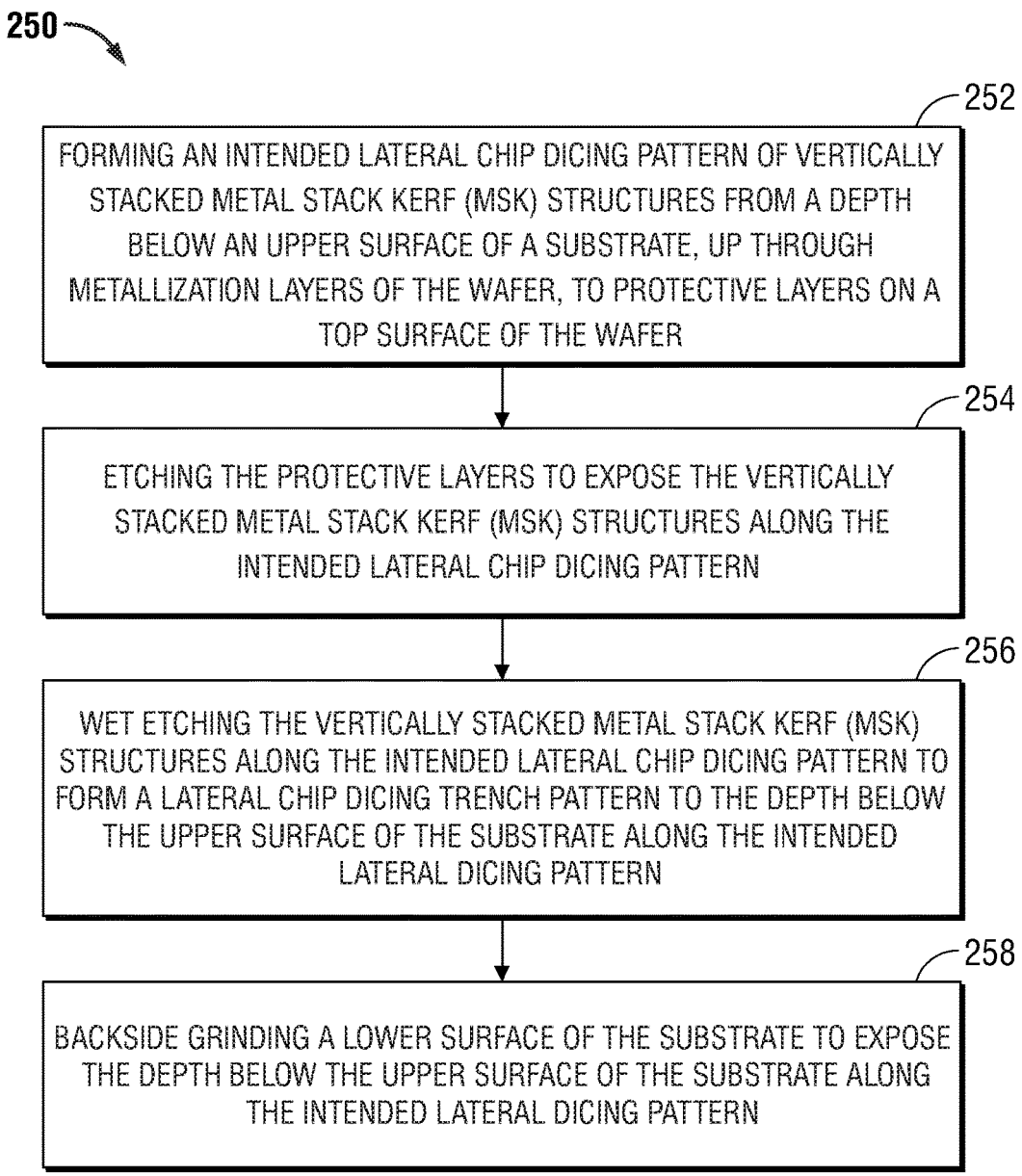
FIG. 2A shows embodiments of processes for dicing integrated circuits from wafers that includes wet etching a lateral chip dicing pattern of "Metal Stack Kerf" (MSK) structures disposed through metallization layers and into a thickness of the substrate of the wafer; then grinding a lower surface of the substrate.

FIG. 2A shows embodiments of processes 250 for dicing integrated circuits from wafers that includes wet etching a lateral chip dicing pattern of metal layer MSK stack structures disposed through a metallization layer and into a thickness of the substrate of the wafer; then grinding a lower surface of the substrate. Some embodiments of process 250 include dicing a semiconductor wafer into chips include, as well as the structures that are used or may result from process 250.

Process 250 begins with block 252 where an intended lateral chip dicing pattern of vertically stacked metal stack kerf (MSK) structures (e.g., pattern 134 of conductive (e.g., conductor material) MSK structures 150) is formed from a depth below an upper surface of a substrate, up through metallization layers of the wafer, to protective layers on a top surface of the wafer. In some cases, block 252 may include forming vertically stacked metal stack kerf (MSK) structures 150 in or along an intended lateral chip dicing pattern (e.g., pattern 134 of conductive MSK structures 150), where forming includes forming structures 150 from a depth below an upper surface of a substrate, up through metallization layers of the wafer, to protective layers on a top surface of the wafer. In some cases, block 252 may include descriptions below for FIG. 3A.

Some embodiments herein (e.g., including embodiments of block 252 or 254) may make use of an additional lithography masking layer (e.g., including layer 310 of block 254). This additional photolithography masking layer is named KE mask (e.g., where "KE" may represent a "kerf etch", or an etch of a MSK structure) and may have a pattern equal with a top perspective view equal to or corresponding to a lateral (e.g., horizontal) pattern (e.g., pattern 134 or 334) for dicing the chips (e.g., chips 120a-b) of a wafer (e.g., wafer 110) (e.g., including opening 320 of block 254). In some cases, a wet etching process of metals is executed in a first part of dicing the wafer, followed by grinding a backside of the wafer or substrate (e.g., blocks 256 and 258).

In some cases (e.g., including embodiments of block 252), during the manufacturing process of a wafer, a stack of metal (or other conducting material) MSK structures (e.g., structures 150) is constructed, wherein the stack of MSK structure layers may be shaped as metallization lines around the chip edges and (vertically) that are vertically connected to each other by appropriate via-contacts (both of which are formed on top of TSV's that extend below the top surface of the substrate) such as to form lateral chip dicing pattern 134 of MSK structures 150. The MSK structures 150 can be shaped as slits along the pattern. As a result, a continuous metal layer stack of MSK structures 150 that is as wide (e.g., width W) as a KE mask opening (e.g., opening 320) or as wide as the kerf-line can be constructed with the resulting stack of metal MSK structures 150 lines (e.g., pattern 134) being aligned to the KE mask (e.g., opening 320) to dice the chips of the wafer as desired (e.g., block 254). In some cases, opening 320 is substantially aligned to (e.g., vertically aligned with or directly above) the lateral dicing pattern 134 along a top surface of the wafer (e.g. top surface of MSK 176 or of layer 226 prior to etching layers 225-226).

As a result, a continuous layer stack of MSK structure metals 150 that is as wide (e.g., width W) as a KE mask opening (e.g., opening 320) or as wide as the kerf-line can be constructed with the resulting stack of metal MSK structures 150 lines (e.g., pattern 134) being aligned to the KE mask (e.g., opening 320) to dice the chips of the wafer as desired (e.g., block 254).

After block 252, process 250 continues with block 254, where the protective layers are etched to expose the vertically stacked metal stack kerf (MSK) structures along the intended lateral chip dicing pattern. In some cases, block 254 may include descriptions below for FIGS. 3B-C.

In some cases, block 254 may include an oxide plasma etch to remove the last protective (e.g., oxide or nitride layer passivation layer, such as layers 225 and 226) and exposes the top metal layer (e.g., MSK 176) of the lateral chip dicing pattern 134 of MSK structures 150.

After block 254, process 250 continues with block 256, where the vertically stacked metal stack kerf (MSK) structures are wet etched along the intended lateral chip dicing pattern to form a lateral chip dicing trench pattern (e.g., pattern 334 of trenches 350) to the depth below the upper surface of the substrate along the intended lateral dicing pattern. In some cases, block 256 may include descriptions below for FIG. 3D.

In some cases, block 254 may include a wet etch based on, for example, hydrogen peroxide, sulfuric acid and water (the combination may be called "Piranha") that can selectively etch away the photoresist 310 (comprising, e.g., an organic material) as well as the stack of lateral chip dicing pattern metal layers (e.g., MSKs 152-176) of the lateral chip dicing pattern 134 of MSK structures 150 to form a pattern 334 of trenches 350 for dicing the chips of the wafer as desired. Such metals can be aluminum, silver, gold, titanium, copper, tungsten, or alloys such as TiN, TaN and similar. Thus, a slit or trenches 350 as wide as the KE mask opening will result and the trenches separate the chips from the wafer (silicon) surface. In some cases, the lateral chip dicing pattern 134 of MSK structures 150 of metal layers and resulting trenches 350 form a lateral chip dicing pattern 134/334 through a metallization layer of a wafer and to a depth t below an upper surface 212 of the substrate 210 below the metallization layer (e.g., 220).

In some cases, such a wet etch shall be based on a properly calibrated $H_2SO_4$: $H_2O_2$: and $H_2O$ solution (e.g., a so-called "Piranha Etch" possibly named for the typical "bubbling" of the hot solution used to perform the etch simulating a feeding school of Piranha fish). Etch rate of metals (or alloys) (e.g., Al, Ag, Au, Ti, Cu, W, TiN, TaN, etc.) typically adopted in semiconductor technology are pretty high whereas etch rate of dielectrics are very slow; therefore, high etch selectivity of metal of the lateral chip dicing pattern of MSK structures 150 to dielectric 222 and 224 and of substrate 210 is expected. In some cases, critical factors to optimize the performance of the Piranha wet etch of metals are expected to be the etch temperature and the relative concentrations of the constituents.

After block 256, process 250 continues with block 258, where a lower surface of the substrate is backside grinded to expose the depth below the upper surface of the substrate along the intended lateral dicing pattern (e.g., to expose the bottom of the trench pattern and dice the chips). In some cases, block 258 may include descriptions below for FIG. 3H; or optionally for FIGS. 3E-H.

In some cases, block 254 may include, subsequently, grinding a lower surface 214 of the substrate 210 (or wafer 110) will dice the chips.

In some cases, process 250 (e.g., see FIGS. 3A-H) may dice all of the chips existing on or desired from the wafer 110. In some cases, no further processing after process 250 (e.g., see FIGS. 3A-H) is required to dice the chips. In some cases, no further processing after process 250 (e.g., see FIGS. 3A-H) is required to dice the chips, except for removal of a foil used to hold the chips from the top for subsequent gripping and placing is required to dice the chips.

By employing the structures and wet etching process (e.g., process 250; and/or see FIGS. 3A-H) of a lateral chip dicing pattern of metal layer MSK stack structures to form a lateral chip dicing trench pattern through a metallization layer of a wafer to a depth below an upper surface of the substrate below the metallization layer in a first part of dicing the wafer, followed by grinding a backside surface of the substrate to dice the chips, the embodiments disclosed herein seek to solve the problem of singulating the integrated circuits manufactured on semiconductor wafers which are separated by a very small distance (e.g., 2 um). In this way, the possible number of chips-per-wafer (CPW) and the surface utilization of the semiconductor wafers are both increased (e.g., see FIGS. 2B-C). As a consequence, the wafer manufacturing costs of the integrated circuits (chips) are reduced. It can be appreciated that in reducing the kerf width to the 2 um, the test and monitor structures normally placed into the kerf can now be rearranged and placed, for example, into a space of one or more chips in the floor plan of the wafer, which is particularly economical for small chip sizes (e.g., see FIG. 5).

Figure 2B:
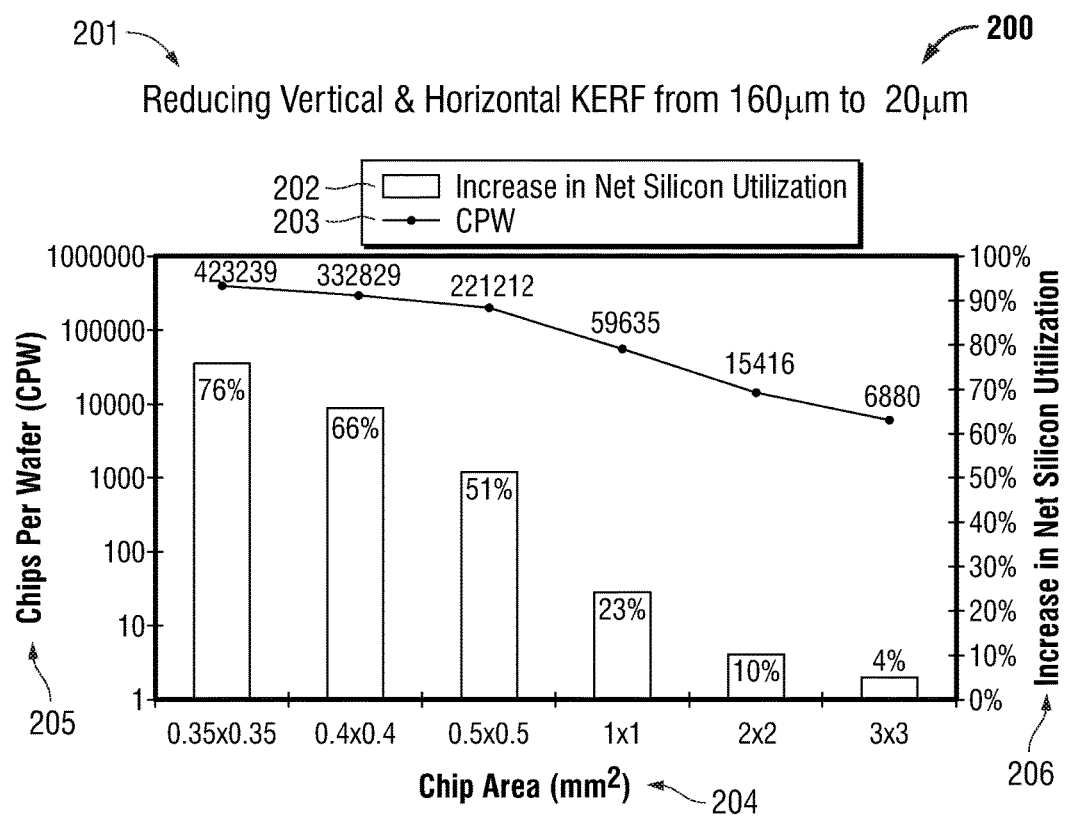
FIGS. 2B-2C display an increase in net silicon utilization by using small scribe-lines, such as those formed by a process including wet etching a lateral chip dicing pattern of a MSK structures extending through a metallization layer and into a thickness of the substrate of the wafer; then grinding a lower surface of the substrate.
Figure 2C:
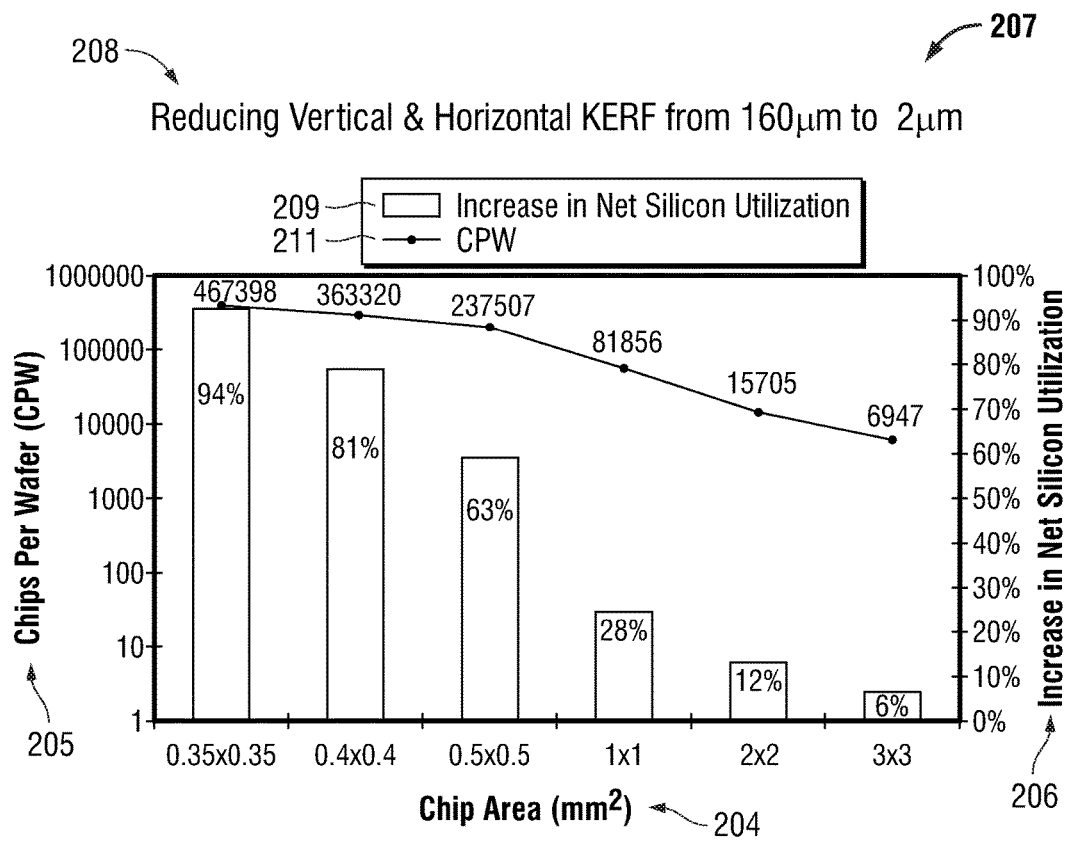

FIGS. 2B-2C displays an increase in net silicon utilization by using small scribe-lines, such as those formed by a process including wet etching a lateral chip dicing pattern of metal layer MSK stack structures disposed through a metallization layer and into a thickness of the substrate of the wafer; then grinding a lower surface of the substrate. FIGS. 2B-C may be an example of results from or related to (e.g., laboratory or test) experiments or simulations that show a net silicon utilization simulation for a wafer of 300 millimeters ("mm") diameter. In some cases, a net silicon utilization simulation may be based on or include as factors: the number of chips desired to be diced per wafer, the chip area of the average (or all) chips to be diced per wafer, and the width of the scribe lines between (e.g., used to dice) the chips on the wafer. In some cases, once the number of chips and chip area are known (e.g., predetermined or previously selected based on a specific design of chips on the wafer), then net silicon usage comparisons can be made by altering the width of the scribe lines based on computer simulation, actual "beta" device testing, or other laboratory testing.

FIGS. 2B-C may take into account (e.g., factor in) that when the width of the scribe line is reduced to only a few microns, it becomes necessary to properly relocate the process monitoring structures (known also as process control monitors, PCM) normally placed in the scribe line, such as by rearranging (e.g., moving) the PCM to the area of one or more dice (e.g., see FIGS. 11A-B). Consequently, a given numbers of dice will be lost on the wafer because they will become "PCM dice" which are not used to produce desired chips. Thus, as a function of die area, the smaller the die area, the more the dice that must be lost to accommodate for the relocation of the PCM.

FIG. 2B may show an increase in "net silicon utilization" for the case of a scribe line of 160 um width reduced to 20 um width (for a Wafer Diameter: 300 mm). FIG. 2B shows a bar chart and graph 200 of reducing lateral pattern (e.g., horizontal) Kerf width from 160 micrometers (um) to 20 um—201. Graph 200 has increase in net silicon utilization bars 202, and graph of chips per wafer (CPW) 203 plotted against vertical axes chips per wafer (CPW) 205 and increase in net silicon utilization 206 and horizontal axis chip area (mm) 204. Vertical axis—chips per wafer (CPW) 205 increases from 1 to 1 million (1E6) chips per wafer; vertical axis—increase in net silicon utilization 206 increases from zero to 100 percent; and horizontal axis—chip area (mm) 204 increases from 0.35 mm×0.35 mm to 3 mm×3 mm.

FIG. 2B may show, as a function of chip area 204 (i.e., the area of one individual chip after singulation), the increase in the number of chips per wafer 203 by reducing the lateral pattern (e.g., horizontal) distance between adjacent integrated circuits or chips from a current reference value of 160 um to a proposed width of 20 um. The lateral pattern distance is also called "kerf width". One benefit of reducing the kerf width to 20 um is most noticeable for small chip areas, such as a chip area 204 of 0.35 mm×0.35 mm. Using a wafer of 300 mm diameter, over 420,000 chips with a chip area of 0.35 mm×0.35 mm can be obtained when a kerf width of 20 um is used. This is about 76% more than the number of chips that can be obtained from the same wafer when a kerf width of 160 um is used. Also, notable is that using a wafer of 300 mm diameter, over 220,000 chips with a chip area of 0.5 mm×0.5 mm can be obtained when a kerf width of 20 um is used. This is about 51% more than the number of chips that can be obtained from the same wafer when a kerf width of 160 um is used.

FIG. 2C may show an increase in "net silicon utilization" for the case of a scribe line of 160 um width reduced to 2 um width (for a wafer diameter: 300 mm). FIG. 2C shows a bar chart and graph 207 of reducing lateral pattern (e.g., horizontal) Kerf width from 160 micrometers (um) to 2 um—201. Graph 207 has increase in net silicon utilization bars 209, and graph of chips-per-wafer (CPW) 211 plotted against vertical axes chips per wafer (CPW) 205 and increase in net silicon utilization 206 and horizontal axis chip area (mm) 204.

FIG. 2C may show, as a function of chip area 204, the increase in the number of chips per wafer 211 by reducing the lateral pattern (e.g., horizontal) distance between adjacent integrated circuits or chips from a current reference value of 160 um to a proposed width of 2 um. One benefit of reducing the kerf width to 2 um is most noticeable for small chip areas, such as a chip area 204 of 0.35 mm×0.35 mm. Using a wafer of 300 mm diameter, over 467,000 chips with a chip area of 0.35 m×0.35 mm can be obtained when a kerf width of 2 um is used. This is about 94% more than the number of chips that can be obtained from the same wafer when a kerf width of 160 um is used. Also, notable is that using a wafer of 300 mm diameter, over 237,000 chips with a chip area of 0.5 mm×0.5 mm can be obtained when a kerf width of 2 um is used. This is about 63 percent more than the number of chips that can be obtained from the same wafer when a kerf width of 160 um is used.

According to some embodiments, chips per wafer and net silicon utilization can be improved (e.g., as shown at least in FIGS. 2B-C) by methods and structures for dicing integrated circuits from a wafer including by wet etching a lateral chip dicing pattern 134 of metal layer MSK stack structures 150 disposed through a metallization layer and into a thickness t of the substrate 210 of the wafer 110; and then grinding a lower surface of the substrate (e.g., as shown at least in FIGS. 3A-H); as compared to other methods and structures (e.g., as described above for FIGS. 1A-C).

Figure 5:
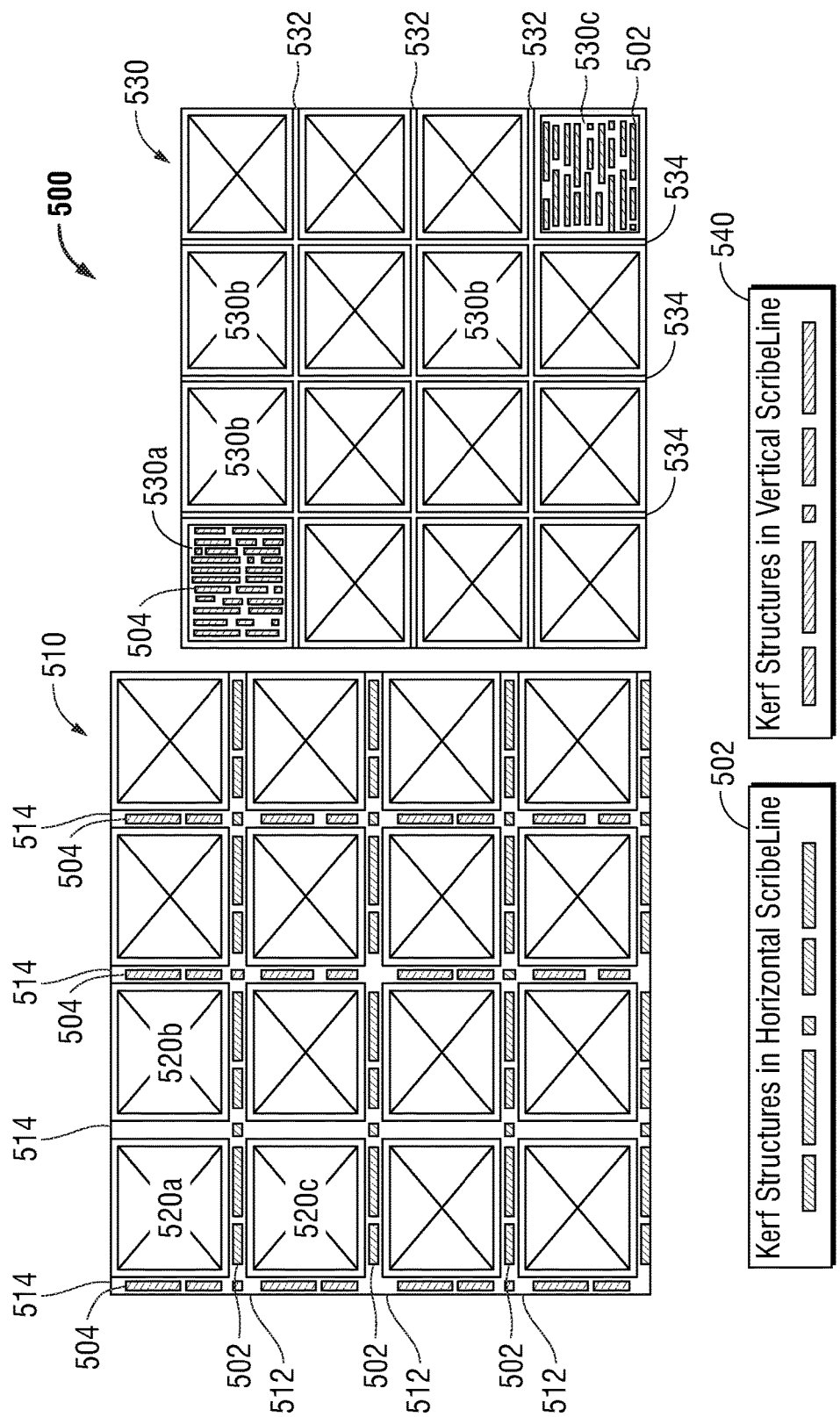
FIG. 5 shows an example of a process control monitor (PCM) relocation strategy for relocating scribe line elements to the area of one or more chips therefore allowing drastic reduction in the width of the original scribe lines.

In some cases, the methods and processes herein (e.g., as shown at least in FIGS. 3A-H represent embodiments where the scribe line structures (e.g., PCM in the scribe lines) have been eliminated and are assumed to be lumped in (e.g., relocated to) concentrated areas of the lithographic reticle (see FIG. 5). In this case, the chips are separated only by the width (W) of the Metal Stack structures 150.

According to some embodiments, for those chips for which a remarkable Net Silicon Utilization improvement can not be achieved (e.g., chip area greater that $3 \times 3$ mm$^2$; see FIGS. 2B-C), the Scribe lines and their structures can be maintained and the dicing pattern 134 of MSK/metal-stack pillar structures 150 on both sides of the scribe channel itself (not shown).

In some cases, as shown in FIGS. 2B-C, a break even point for balancing having the PCMs structures occupying the location where a chip otherwise would be desired, and increasing the chips per wafer, is for chips of 3×3 millimeter squared or 4×4 millimeters squared or smaller. This is because there are more kerf lines when there are more chips. On the other hand, for chips having a 4×4 millimeter squared through 10×10 millimeter squared, using a wet etch followed by a backside grind does not provide as much of the benefit of increased chips per wafer.

According to some embodiments, dicing a semiconductor wafer into chips includes (e.g., methods and structures that may result from the methods) wet etching a lateral chip dicing pattern of metal stack kerf structures to form a lateral chip dicing trench pattern through a metallization layer of a wafer to a depth below an upper surface of the substrate below the metallization layer; and grinding a lower surface of the substrate to dice the chips.

Some embodiments of dicing a semiconductor wafer into chips include (and structures may result from) forming an intended lateral chip dicing pattern of vertically stacked metal stack kerf (MSK) structures (e.g., pattern 134 of MSK structures 150) from a depth below an upper surface of a substrate, up through metallization layers of the wafer, to protective layers on a top surface of the wafer; wet etching the MSK structures along the intended lateral chip dicing pattern to form a lateral chip dicing trench pattern (e.g., pattern 334 of trenches 350) to the depth below the upper surface of the substrate along the intended lateral dicing pattern; and backside grinding a lower surface of the substrate to expose the depth below the upper surface of the substrate along the intended lateral dicing pattern (e.g., to expose the bottom of the trench pattern and dice the chips). In some cases, prior to wet etching, the protective layers are etched to expose the vertically stacked metal stack kerf (MSK) structures along the intended lateral chip dicing pattern.

FIGS. 3A-3H may show structures and processes of a process flow of dicing a wafer 110 in accordance with embodiments disclosed in this document that include wet etching a lateral chip dicing pattern of conductive (e.g., conductor material) MSK structures extending through a metallization layer and into a thickness of the substrate of the wafer; then grinding a lower surface of the substrate. The relatively low costs of these processes may allow the economical implementation of a narrow scribe-line or kerf width which leads to lower chip manufacturing costs. Before embodiments of process processes are outlined, embodiments of wafer 110 is described in more detail with respect to FIG. 3A. In some cases, any or all of the features in FIGS. 3A-H are not drawn to scale, such as not to scale with respect to each other.

FIGS. 3A-3H show wafer 110 having a first metallization level LV1 above top surface 212 of substrate 210. Metallization level LV2 is formed on or above level LV1 in a direction up from surface 212. Metallization level LV3 is formed on or above level LV2. Metallization level LV4 is formed on or above level LV3. Metallization level LV5 is formed on or above level LV4. Metallization level LV6 is formed on or above level LV5. Although 4 metallization levels are shown between levels LV1 and LV6, it can be appreciated that there may be more metallization levels between levels LV1 and LV6, such as between 5 and 15. Similarly there may be fewer, such as between 0 and 3.

Level LV6 may be considered a "top" layer such as an upper or topmost or exposed layer (e.g., a final build-up (BU) layer, BGA, LGA, or die-backend-like layer) of an IC chip (e.g., such as microprocessor, coprocessor, graphics processor, memory chip, modem chip, or other microelectronic chip devices) which may be mounted onto (or have mounted onto it) a package device (e.g., a socket, an interposer, a motherboard, or another next-level component).

Figure 3A:
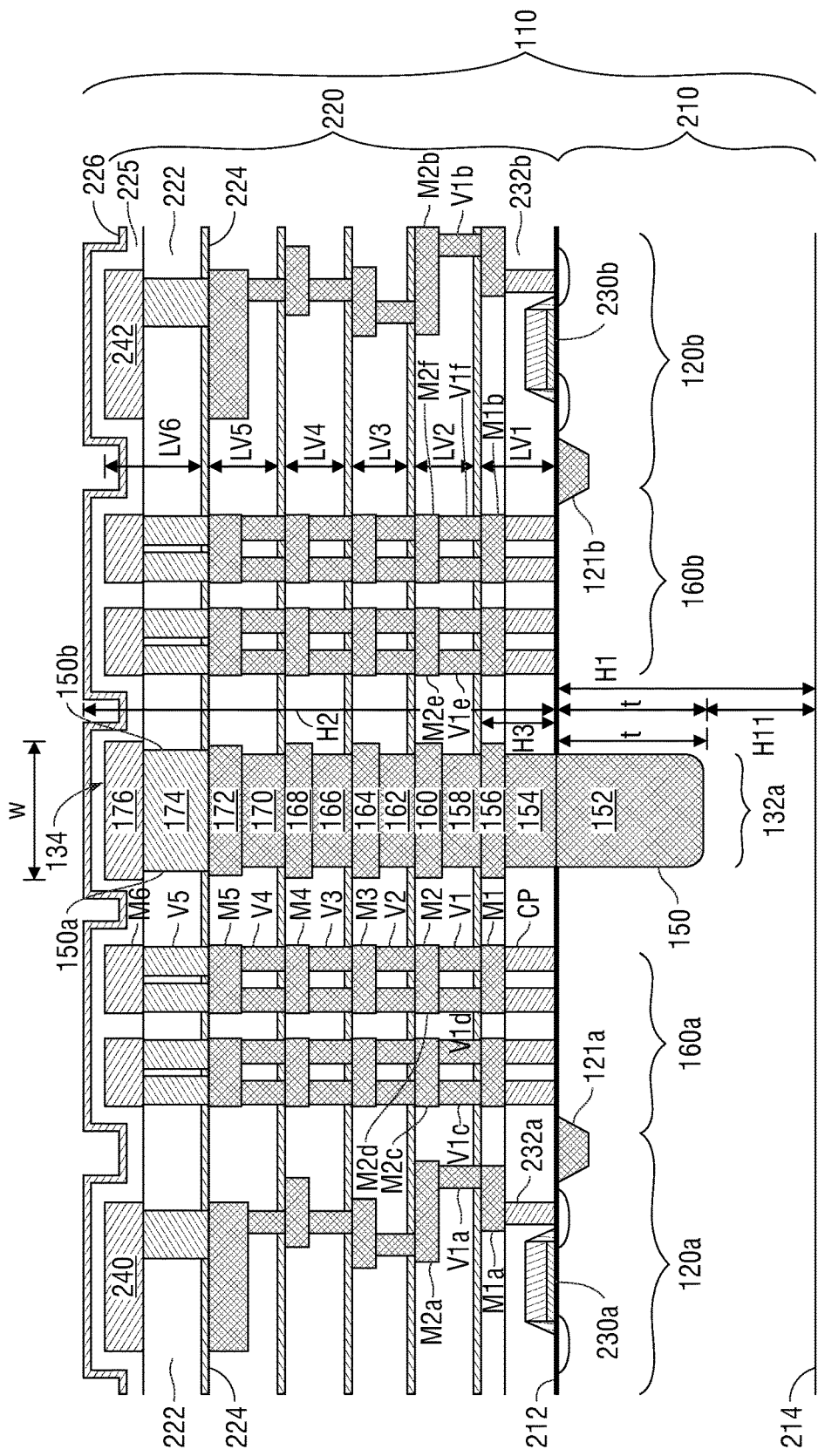
FIGS. 3A-3H show a possible process flow and structures for dicing a wafer according to the teachings disclosed herein, such as a process including wet etching a lateral chip dicing pattern of a MSK structure extending through a metallization layer and into a thickness of the substrate of the wafer; then grinding a lower surface of the substrate.

FIG. 3A shows a cross-section diagram through the wafer 110. FIG. 3A shows wafer 110 after completion of back-end of line (BEOL) processing to form stack 220 (and stack 150). FIG. 3A shows wafer 110 having substrate 210 with height H1 which includes thickness t plus height H11, and having metallization stack 220 having vertical height H2 which includes height H3 of lowest metallization layer M1 and contact plug (CP) layer.

FIG. 3A shows a cross-section diagram through the wafer 110. The cross-section goes through a first chip 120a and an immediately adjacent second chip 120b; seal ring 160a for sealing (e.g., against moisture, particles, and physical separation of layers) the perimeter chip 120a (once diced); seal ring 160b for sealing the perimeter chip 120b (once diced); and dicing or vertical kerf line region 132a disposed between (and optionally immediately adjacent to) seal rings 160a and 160b. In some cases, in FIG. 3A the first chip 120a is shown on the left-hand side and the second chip 120b is shown on the right hand side of region 132a, and both chips (and seal rings 160a and 160b) are separated by a vertical kerf line region 132a, which may represent a lateral chip dicing pattern 134 of MSK structures 150. The wafer 110 comprises a substrate 210 with a first surface 212 and a second surface 214, wherein a layer stack 220 is formed on the first surface 212. The layer stack 220 has an assembly of layers of alternating first material 222 and a second material 224.

The layer stack may include levels LV1-LV6, each having a metal or upper contact layer; and a lower or via contact layer. Each level may also include (e.g., in the layers and horizontally adjacent to the metallization or vias) first dielectric material 222 that includes, for example, silicon oxide, and second dielectric material 224 that includes, for example, a nitride. In some cases, layer 224 is a thin layer of tantalum nitride or aluminum nitride, or another metal plus nitride. In some cases this layer has a high electrical resistance and it may be described as a dielectric. Under and along the layers of the second material 224 levels for metallizations are shown as metal layers M1, . . . , M6, which are separated by the first material 222. Each of the metal layers M1, . . . , M6 comprise different parts (a plurality of components) formed at laterally different places along the layer stack 220. For example, a first part of the first metal layer M1a is formed at the first chip 120a and a second part of the first metal layer M1b is formed at the second chip 120b, etc. The metal layers M1, M2, . . . , M6 can moreover be connected by via-contacts V1, V2, . . . , V5. For example, the via-contact V2a connects the metal layers M1a with M2a (in the first chip 120a). The first metal layer M1 can be connected to the substrate 210 by contact plugs CP. In the layer stack, the number of metallizations may be 1, 2, 3, 4, 5, 6, or more. The number of via layers is typically one less the number of metallizations.

In some cases, during the so-called "back-end of the line" (BEOL) processing processes, intended to build the metallization structures which connect the electrical nodes of the integrated circuit (e.g., metal layers M1-M6, and via layers V1-V5), a suitable stack of metal structures 150 may be constructed. In some cases, each layer of metal structures 150 is made of the same conductor material metals as each layer of the build the metallization structures which connect the electrical nodes of the integrated circuit (e.g., metal layers M1-M6, and via layers V1-V5). In some cases, this includes layer 154 being the same material as CP or first contact plug 232a. In some cases, this includes layer 152 being the same material as CP or first contact plug 232a. In some cases, each layer of metal structures 150 is made of the same metals, such as a metal of any one of the build the metallization structures which connect the electrical nodes of the integrated circuit (e.g., metal layers M1-M6, and via layers V1-V5).

This stack of metal structures may also be called metal stack kerf (MSK) structures 150. The MSK structures 150, may extend thickness t below top surface 212 of the substrate; and may be located just around all the sides of the chips and in the region (e.g., region 132a) where the separation of the chips has to be performed. MSK structures 150 may be a solid horizontal pattern 134 of a solid vertical stack of conductor material such as one or more metal layers formed upon and physically touching each other. In some cases, BEOL processing of wafer 110 may include forming the metallization layers (e.g., metal layer M1-M6) of chips 120a and 120b above devices 230a and 230b as well as forming MSK structures 150, including parts or MSKs 152-176. In some cases, structures 150 is or includes MSK 176 formed onto MSK 174 (e.g., a bottom surface of MSK 176 grown from or touching a top surface of MSK 174), MSK 174 formed onto MSK 172, MSK 172 formed onto MSK 170, MSK 170 formed onto MSK 168, MSK 168 formed onto MSK 166, MSK 166 formed onto MSK 164, MSK 164 formed onto MSK 162, MSK 162 formed onto MSK 160, MSK 160 formed onto MSK 158, MSK 158 formed onto MSK 156, MSK 156 formed onto MSK 154, and MSK 154 formed onto MSK 152 along pattern 134. It is worth noticing that MSK 176 through 156 may be formed during the same wafer processing processes utilized to form the M1-M6 and V1-V5 layers and structures; and that MSK 154 and 152 may, in some cases, be constructed as part of suitable through silicon via (TSV) formation processes.

According to some embodiments, MSK structures 150 include TSV layers 152 and 154; metallization layers 168, 160, 164, 168, 172 and 176; and metal via layers 158, 162, 166, 170 and 174. According to some embodiments, MSK structures 150 include TSV layers 152 and 154 formed by a TSV layer forming process and of the same material as CP or first contact plug 232a. According to some embodiments, MSK structures 150 include metallization layers 168, 160, 164, 168, 172 and 176 formed by a metallization layer forming process and of the same material as metal layers M1-M6. According to some embodiments, MSK structures 150 include metal via layers 158, 162, 166, 170 and 174 formed by a metal via layers forming process and of the same material as metal via layers V1-V5.

It can be appreciated that additional (or fewer) metallization (as compared to metallization layers M1-M6) and via layers (as compared to metal via layers V1-V5) might exist depending on the desired structure of chips 120a-b. If there are additional (or fewer) metallization and/or via layers, structures 150 may include an equal number of additional (and/or fewer) metallization (as compared to metallization layers 168, 160, 164, 168, 172 and 176) and via layers (as compared to metal via layers 158, 162, 166, 170 and 174). These additional (or fewer) metallization and/or via layers of structures 150 may be formed by the same process and of the same material as the additional (or fewer) metallization (as compared to metallization layers M1-M6) and via layers (as compared to metal via layers V1-V5).

In some cases, lateral dicing pattern 134 of the MSK structures 150 is laterally disposed between seal rings of all surrounding perimeters (e.g., edges) of all adjacent chips of the semiconductor wafer that are desired to be diced. This dicing pattern (and/or the trench 150 resulting from etching structures 150 in this pattern) may separate or define the perimeters (or edges) of the chips to be diced. In some cases, lateral dicing pattern 134 of the MSK structures 150 form a plurality of loops that laterally enclose the plurality of transistor chips of the wafer; and the lateral dicing pattern 134 of the MSK structures 150 is laterally disposed between seal rings of adjacent chips of the semiconductor wafer. In some cases, pattern 134 is a slit, path or loop of structures 150 that laterally enclose the plurality of chips of the wafer. In this case, the chips including transistors, diodes, electronic devices and/or electromechanical devices formed on a substrate main surface. In this case, structures 150 may be a solid vertical stack of conductor material such as MSK layers 150-176 formed upon and physically touching each other.

The layers of MSK structures 150 (e.g., MSK 152-176) may each be a layer of a conductive material or metal. Such material may be or include copper, aluminum, tungsten, gold, silver, titanium, tantalum, and the like. Such material may be a metal or an alloy including the materials just listed. Such material may be Al, Ag, Au, Ti, Cu, W, TiN, TaN, or an alloy thereof.

Such a MSK stack structures 150 of metals can be formed by making use of typical TSVs in substrate 210 to thickness t; and use metallization and via layers of layers LV1-LV6, to form a stack of metals at region 132a (e.g., to form lateral chip dicing pattern 134 of or for structures 150). In some cases, structures 150 includes a stack of MSKs including TSV portion 154 vertically connecting lower TSV portion 152 (extending down thickness tin substrate 210) to upper MSK portion 156 of the first metal layer M1. In some other cases, a version of structures 150 may be an intermediary structure that only includes TSV portion 154 vertically connecting lower TSV portion 152 (extending down thickness tin substrate 210) to upper MSK portion 156 of the first metal layer M1.

In some cases, after TSV portions 152 and 154 are formed, the rest of structures 150 may be formed, exactly as (e.g., during the same processing or with) the rest of the metallization and interconnect lines that are built within the chip 120a, 120b in metal layers M1-M6 to form stack 220. In some cases, after TSV portions 152 and 154 are formed, the rest of structures 150 may be formed, exactly as (e.g., during the same processing or with) the rest of the metallization and interconnect lines that are built within the chip 120a, 120b in layers L1-L6 (or layers V1 to L6) to form stack 220.

In some cases, MSK structures 150 forms pattern 134 opening having a minimum cross-sectional width W with respect to a length direction (e.g., into the page of FIG. 3A) that forms a pattern equal from a top perspective (e.g., looking down on wafer 110 from above, such as onto layer 226) that is lateral pattern 134 for dicing the chips. In some cases, MSK structures 150 extends vertical thickness t below surface 212, where t may be a thickness of between 10 and 100 micrometers (um) as shown by thickness small t which may be described as a depth or a distance into substrate 210 below surface 212. In some cases, thickness t will set or be the maximum final die or chip thickness for chips (e.g., chips 120a-b) that are diced from wafer 110 as described herein (e.g., as described for FIGS. 3A-H).

Structure 150 has an outer sidewalls 150a forming one wall of metal of structures 150 along pattern 134. Structure 150 also has a widthwise or laterally opposing outer sidewalls 150b forming a second wall of metal of structures 150 along pattern 134. Sidewalls 150a and 150b may extend vertically straight above and extend along pattern 134 (including in region 132a) from thickness t below surface 212 to the top of stack 220, top MSK 176, level LV6 or layer M6.

In some cases, lateral chip dicing pattern 134 of MSK structures 150 includes levels which are formed during the normal wafer processing processes used to form devices 230a-b and levels LV1-LV6 (e.g., including processes for forming layers CP, layers M1-M6 and layers V1-V5).

In some cases, such a lateral chip dicing pattern 134 of MSK structures 150 surround each die (e.g., including chips 120a-b) on all of its sides and is built by integrating metallization layer and vial layer technology (e.g., used here to also form the part of the metal stack 220 in the bulk of the semiconductor wafer) to form the pattern 134 to a thickness (e.g., height or depth) "t" below surface 212 of the wafer. In some cases this is done with a normal dual damascene process integration scheme.

Thickness t may also represent a distance below surface 212 along a trench such as defined along region 132a or pattern 134. In some cases, once structure 150 is removed, thickness t represents a thickness or depth below surface 212 and into substrate 110 of a bottom of lateral chip dicing trench pattern 334 (e.g., where pattern 334 has a top perspective view equal to or corresponding to pattern 134 or region 132a).

It can be appreciated that metallization layers and via layers are typically formed (e.g., see metal layers M1-M6, and via layers V1-V5) in the chip regions 120a and 120b such as to electrically connect devices 230a and 230b through metallization and via contacts to each other or surface contacts of each chip. Therefore, it is counter intuitive for a metallization layer and via layer structure, such as MSK structures 150 to be formed between seal rings 160a and 160b, for at least the reason that these MSK structure are now formed outside the actual area of the chip (e.g., MSK structures 150 is between the chip seal rings). As noted herein, typically the area between the sealed rings includes a wide curve line street or area that does not include metallization layer and via layer structures (e.g., such as MSK structures 150), but may include processing control monitor (PCM) structures. Moreover, metallization layer and via layer structures (e.g., such as MSK structures 150) are typically not formed below surface 212, since they are typically used to electronically connect electronic devices 230a and b to structures above those devices. Consequently, it is also counter intuitive for MSK structures 150 to be formed (e.g., to a thickness t) below surface 212 into substrate 210, such as is shown for MSK structures 150, having dicing pattern 134.

In the embodiment as shown in FIG. 3A, there are six layers with the first material 222 separated by five layers with the second material 224 (e.g., to form levels LV1-LV6). When viewed from the first surface 212 of the substrate 210, the last layer in the layer assembly 220 comprises a dielectric isolation layer 226 and a further dielectric isolation layer 225 which comprise, for example, an oxide and a nitride, respectively. The combination of the isolation layer 226 and the further isolation layer 225 may serve as a final passivation of the wafer 210 and the layer stack 220. Of course, other numbers of layers 222, 224 may be used as well, and the sequence of the layers may be varied to the extent that more than two types of materials are arranged one upon the other. Accordingly, although in the following the number N of layers Mi where 0<i<N is assumed to be 6, other numbers may be used as well. In some cases, i may be between 2 and 6. In some cases it may be between 6 and 12. In some cases it may be between 4 and 10.

The substrate 210 comprises a first device 230a arranged in the first chip 120a and a second device 230b arranged in the second chip 120b. The first and the second device 230a and 230b can, for example, include an electronic device such as a transistor with doped regions in the substrate 210 (comprising, for example, silicon). In some cases they may represent an electronic device such as a capacitor, diode, PN junction, resistor or inductor. In some cases they may represent a number of these electronic devices. The first device 230a can be connected to the metal layer M1a by a first contact plug 232a and the second device 230b can be connected to the metal layer M1b by a second contact plug 232b. The metal layers M1a and M1b are in turn connected to the metal layers M2a, M3a, . . . , M6a and M1b, M2b, . . . , M6b by the via-contacts V1a, . . . , V5a and by V1b, . . . , V5b. The first chip 120a is sealed by a first seal ring 160a and the second chip 120b is sealed by a second seal ring 160b, wherein the first and second seal rings 160a and 160b each comprises two components of the metal layers M1, M2, . . . , M6, which are connected by two components of the via-contacts V1, V2, . . . , V5.

The seal rings 160a, 160b may be between 2 and 8 um wide. In some cases they are as wide as a few tens of micrometers.

In more detail, the metal layers Mi=(M1, M2, M3, . . . , M6) may comprise a plurality of components Mia, Mib, Mic, Mid, Mie and Mif (the index i=1, 2, . . . , 6 counts the different levels). The metal layers Mia are arranged at the first chip 120a, the metal layer Mib are arranged at the second chip 120b, the third and fourth metal layers Mic and Mid are arranged at the first seal ring 160a and the metal layer Mie and Mif are arranged at the second seal ring 160b. The metal layers Mi are connected by the via-contacts Vi, wherein the component Via of the via-contacts Vi contact the metal layers Mia at the first chip 120a, the via-contacts Vib connect the metal layers Mib at the second chip 120b, the via-contacts Vic and Vid connect the metal layers Mic and Mid at the first seal ring 160a. The via-contacts Vie and Vif connect the metal layer Mie and Mif at the second seal ring 160b. In this way, the first surface 212 is connected with the last metal layer M6, which in turn is separated from the isolation layer 226 by a last part of the first material 222 (i.e., the further isolation layer 225).

Possible materials for structures 150, the metal layers and the via-contacts may be or include conductor materials such as metals and alloys. They may include aluminum, silver, gold, titanium, copper, tungsten, or alloys such as TiN, TaN and similar. In some cases, possible materials for the metal layers M1, M2, . . . , M5 may include aluminum or copper, the metal layer M6 can include aluminum, the via-contacts V1, V2, . . . , V6 can include aluminum or copper. The via-contact V5 and the contact plugs CP can include tungsten. These are exemplary materials and other embodiments may comprise different materials. In addition, the numbers of layers as well as the number of metallizations differ in other embodiments.

In some embodiments depicted in FIG. 3A, the chips formed within the substrate 210, the stack 220 and isolation or passivation layer 226, 225 may be completely processed in that these chips merely need to be diced and no further processing regarding the schematics of a circuitry of the chips is necessary. Some portions of the upper metal layer M6 may form or may be contacted with contact pads 240 for chip 120a and 242 for chip 120b as shown in FIG. 3A and the subsequent figures. The contact pads allow for an external contact of the circuitry of the chips and will be uncovered by the isolation layer 226 which otherwise overlays all chip areas, as shown in subsequent figures.

According to embodiments, kerf-line region 132a may represent a cross section of one part or lateral (e.g., horizontal) path of lateral chip dicing pattern 134 of metal layer MSK stack structures 150, such as a pattern for dicing each chip to be diced or desired to be diced from wafer 110. Also, in some cases, kerf-line region 132a may represent a cross section of one part or lateral (e.g., horizontal) path of lateral (e.g., horizontal) path of lateral chip trench pattern 334 of trenches 350 (e.g., where pattern 334 has a top perspective view equal to or corresponding to pattern 134 or region 132a), such as a pattern for dicing each chip to be diced or desired to be diced from wafer 110.

Along the vertical kerf-line region 132a, pattern 134 and pattern 334, the stack 150 comprises conducting materials from the bottom of thickness t below first surface 212 to the last metal layer level M6. Hence, the kerf-line region 132a, pattern 134 and pattern 334 include a layer stack structures 150 being formed, e.g., by a plurality of metal layers vertically connected to each other through thickness t and levels LV1-LV6 (e.g., including the metal layers M1, M2, M3, . . . , M6, which in turn can be connected by via-contacts V1, V2, . . . , V5). On the last metal level M6, there are two isolation layers 225 and 226, which again protect the top surface of wafer 110. On the other side of layer M1, contact plugs CP connects the first metal level M1 with the substrate 210 for chips 120a-b; and rings 160a-b. Also, on the other side of layer M1, MSK 154 (e.g., which may also be called a "contact plugs CP") connects the first metal level M1 of structures 150 with MSK 152 of structures 150 (which extends down thickness t into the substrate 210).

A possible material of the six level M6 of metal layers is aluminum, the via-contacts V5 and the contact plug CP between the first metallic layer M1 and the substrate 210 can, for example, comprise tungsten and the material of the metal levels M1 to M5 as well as the via-contacts V1-V4 can, for example, comprise aluminum or copper. In some cases, MSKs 152-154 are TSVs formed of copper.

In some cases, pattern 134 of MSK structures 150 (and pattern 334 of trenches 350) surrounding each chips (e.g., die) of wafer 110 on all of its sides such as by "completely surrounding" each chip so that a beginning horizontal location of a lateral chip dicing pattern 134 of MSK structures 150 completely surrounding each of the chips extends around a horizontal area of each chip and physically attaches to or touches an ending horizontal location of the same MSK structures 150 at a horizontal location of or on the chip. In some cases, metallization layer and via layer structure structure pattern technology for forming structures 150 is added to the metallization layer and via layer structure processing already being performed on parts of the chips 120a-b to form metallization levels LV1-LV6. In some cases, this metallization layer and via layer structure pattern technology for forming MSKs 154-176 of structures 150 is part of the processing processes (e.g., in addition to the already expected or prior MSK structures to form metallization levels LV1-LV6, but formed during the same processing) so only minimal additional processing (e.g., for TSV 152) is required as the TSV processing already being performed on parts of the chips 120a-b to form stack 220.

In some embodiments, FIG. 3A includes forming a lateral dicing pattern 134 of a MSK structures 150 to a depth t below a first main surface 212 of a wafer substrate 210 of the wafer, the lateral dicing pattern laterally between and separating each of a plurality of transistor chips (e.g., chips 120a-b) formed on the main surface; and forming a final passivation layer (e.g., layer 225 and/or 226) over the MSK structures and a top surface of the wafer.

In some cases thickness t is between 10 and 100 micrometers (um). It may be a thickness of between 10 and 50 um. In some cases thickness t is between 40 and 50 um. In some cases this depth may be 15 to 40 um. It may be 20 to 30 um. It may have a minimum depth of 10 um. It may have a minimum depth of 1 um. In some cases thickness t is between 40-80 micrometers. In some cases it is between 40 and 100 micrometers, and width W is between 1 and 10 um.

In some cases, width W is between 1 and 10 um. In some cases it is between 2 and 10 um. In some cases it is between 2 and 7 um. In some cases it is between 2 and 5 um. In some cases it is between 2 and 3 um. In some cases it is 2 um.

In some cases height H1 between 600 and 1,000 micrometers. In some cases it is between 600 and 800 micrometers.

In some cases height H11 is equal to height H1 minus thickness t (e.g., H11=H1−t).

In some cases height H2 is between 3 and 4 micrometers. In some cases it is between 1 and 7 um. In some cases, it can range from a few micrometers up to a few tens of micrometers In some cases height H3 may be between 0.5 and 2 micrometers. In some cases thickness H3 is between 0.6 and 1 um. In some cases it is 0.6 and 0.7 micrometers. In some cases the height of the contact plug CP layer is between 0.8 and 1 micrometer.

In some cases the width of metallization such as M1a is between 50 and 80 nanometers. In some cases the height of metallization M1 is between 0.2 and 0.7 micrometers and sometimes it is 0.5 micrometers. In some cases, it may range from a few tens of nanometers up to a few hundreds of nanometers.

FIG. 3A also shows shallow trench isolation (STI) 121a between device 230a and seal ring 160a of chip 120a. It also shows STI 121B between device 230b and seal ring 160b of chip 120b. The lateral distance or width between STI 121a and sidewall 150a may be between 20 and 30 micrometers. It may be the same between STI 121b and sidewall 150b.

In some cases, VIA contacts (such as V1, V1a, . . . ) formed as part of chip 120a or 120b which connect metal layers (such as M1 to M2) may have a circular shape when seen from above with a width or diameter that highly depends on how advanced the technology is. In some cases, they can range from a few tens of nanometers up to a few micrometers; and MSKs 152 through 176 have a rectangular or line shape when seen from above along the closed-loop length of pattern 134 with a width of 2-5 micrometers.

According to some embodiments of the invention, only substrate 210 and level LV1, or layers CP+M1 having VIAs 152 and 154 (e.g. forming an intermediary "MSK" stack 150') are necessary. In these embodiments, levels LV2-LV6 are not needed and do not exist. It can be appreciated that this intermediary structure can then have further metallization layers formed on it, such as levels LV2-LV6, as described for FIG. 3A.

Figure 3B:
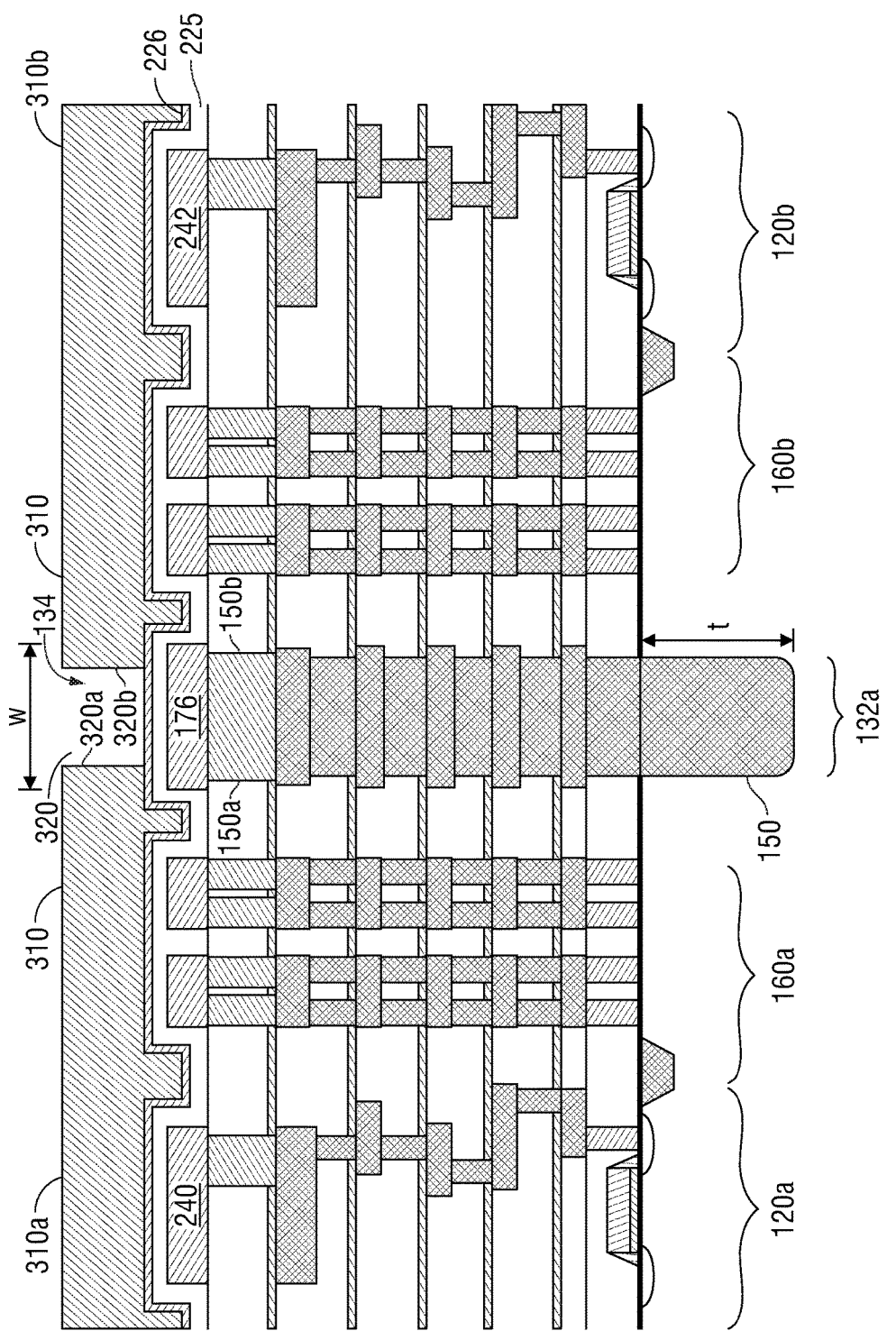

FIG. 3B may show an after lithographic process described as "singulation" which is used as part of dicing of the chips of wafer 110. FIG. 3B shows resist layer 310 (e.g., a photoresist or mask) formed on or over a top surface (e.g., top of layer 226) of wafer 110; and having opening 320 separating parts 310a and 310b along lateral (e.g., horizontal) pattern (e.g., pattern 134 or 334) for dicing the chips (e.g., chips 120a-b) of wafer 110. In some cases, forming resist layer 310 is an additional lithographic process (e.g., processing "process") that increases by 1 the number of lithographic processes necessary to complete wafer processing in the "Frontend Fabrication" of the wafer. However, in many cases, due to the relaxed critical dimensions of width W (e.g., wideness of W), it is a low cost-adder processing process. In most cases, any available depreciated lithographic processing tool available shall have the process capability to perform such a process. The material of resist 310 may be a photo resist or mask having a thickness of between 2-4 micrometers. In some cases, resist 310 is an organic material.

After explaining the structure of the wafer (see FIG. 3A), some embodiments of the actions of dicing are described next. In an embodiment of a first action of dicing the wafer 110, a KE (e.g., a "kerf etch") resist layer 310 (see FIG. 3B) may be deposited on the isolation layer 226. The KE resist layer 310 can, for example, comprise an organic material and is patterned by using a KE photolithographic mask. In particular, in some embodiments, the following actions may be performed. Forming a photoresist layer (KE) and performing a photolithographic process to selectively remove a photoresist KE above the metal stack kerf region 132a, or pattern 134. This may include removal over a cross-sectional width W with respect to a length direction (e.g., into the page of FIG. 3A) of the lateral pattern 134 for dicing the chips.

In some cases, FIG. 3B shows a result of patterning of the KE resist layer 310 with first part 310a having an inner sidewalls 320a forming one wall of opening 320. Layer 310 also has second part 310b having an inner sidewalls 320b forming an opposite wall of opening 320. Sidewalls 320a may extend vertically straight above and extend along pattern 134 (including in region 132a) with the corresponding sidewalls 150a of stack 150. Sidewalls 320b may extend vertically straight above and extend along pattern 134 (including in region 132a) with the corresponding sidewalls 150b of stack 150.

In some cases, resist 310 is an organic material that is "spun on" to the surface (e.g. top surface of layer 226) of wafer 110 as a dense liquid. Thus, resist 310 may blanket that surface (1) covering over the different shapes of the topmost MSK 176 of structures 150; (2) filling in between MSK 176 and any adjacent contact pads; and (3) covering and filling in between the contact pads. The covering and filling may be assisted or caused by resist 310 being pulled downward by gravity when it is spun on or given time to settle.

Part 310a and 310b may be described as separated by an opening 320 due to the patterning, such as due to the removal of layer 310 where opening 320 now exists. The opening 320 is positioned along the vertical kerf-line 132a, or pattern 134 (which continues in the direction perpendicular to the drawing plane). Opening 320 may be an opening having a cross-sectional width W with respect to a length direction (e.g., into the page of FIG. 3A) that forms a pattern equal from a top perspective of lateral pattern 134 for dicing the chips.

Once the KE photoresist layer has been coated onto the wafer 110 and adheres onto layer 226, the photolithographic process KE pattern is executed. The patter from the KE photolithographic mask is transferred into the KE resist layer (latent image); once the KE resist development is performed, the opening 320 will be formed. KE resist 310a remains on top of chip 120a and seal ring 160a; KE resist 310b remains on top of chip 120b and seal ring 160b. Layer 226 is not covered by KE resist.

In some cases, layer 310 (and parts 310a-b) is an additional lithography masking layer that is added to processing of wafer 110 in order to dice the chips of the wafer. This additional photolithography masking layer may be named a KE mask (KE=kerf etch) and may have a pattern equal with a top perspective view to or corresponding to a lateral (e.g., horizontal) pattern (e.g., pattern 134 or 334) for dicing the chips (e.g., chips 120a-b) of wafer 110. In some cases, assuming that the protective layers 226 and 225 have been removed, a subsequent wet etching process of metals of structures 150 executed in a first part of dicing the wafer, followed by grinding a backside of the wafer or substrate are also added to processing of wafer 110 in order to dice the chips of the wafer.

Figure 3C:
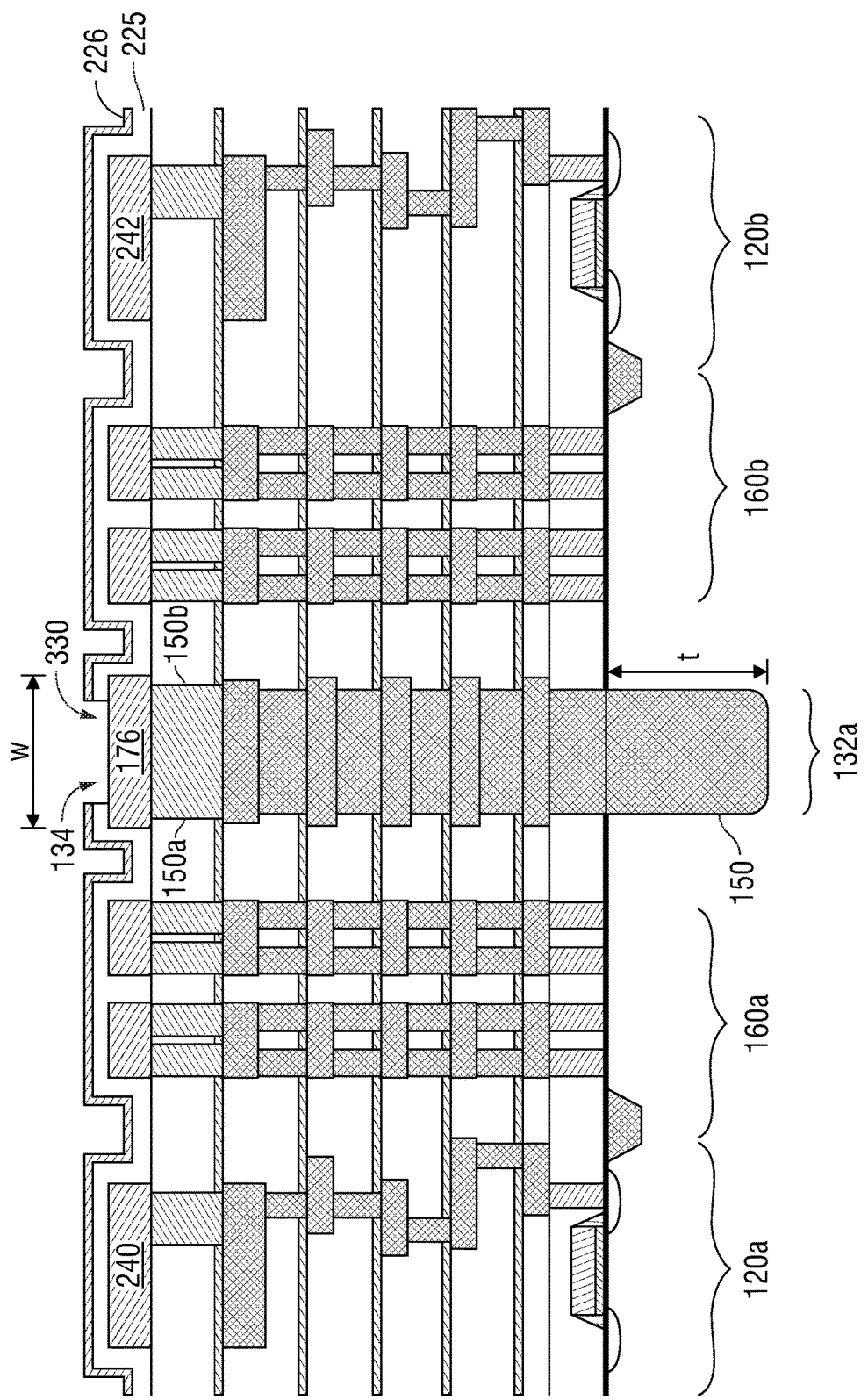

FIG. 3C may show the result of a dry etch and resist ash process performed after the KE (e.g., kerf etch) lithographic process described as "singulation" (e.g., after FIG. 3B) which is used as part of dicing of the chips of wafer 110. FIG. 3C shows layers 226 and 225 formed on or over a top surface (e.g., top of metallization level LV6 or layer M6) of wafer 110; and having opening 330 exposing topmost MSK 176 of structures 150 along (e.g., over from above, along laterally, and having a same width W as the entire pattern 134) lateral (e.g., horizontal) pattern (e.g., pattern 134 or 334) for dicing the chips (e.g., chips 120a-b) of wafer 110. In some cases, the dry etch and resist ash process to form opening 330 is an additional dry etch and resist ash process (e.g., processing "process") to remove passivation layers 226 and 225, that increases by 1 the number of dry etch and resist ash processes or processing necessary to complete wafer processing in the "frontend fabrication" of the wafer. However, in many cases, due to the relaxed critical dimensions of width W (e.g., wideness of W), it is a low cost-adder processing process. In most cases, any available depreciated dry etch and resist ash processing tool available shall have the process capability to perform such a process.

In some cases, in FIG. 3C an action of selective etching is (or has been) performed in order to remove the dielectric isolation layer 226 and the further dielectric isolation layer 225 which comprise, for example, a silicon oxide and a nitride. As a consequence, the sixth level of metal layers M6 (e.g., MSK 176) of stack 150 is exposed along the opening 330, along pattern 134. This may expose, from a top perspective view, top surface of MSK 176 of stack 150 along or of pattern 134. In some cases, a dry plasma etch (or, alternatively a wet chemical etch) may be described as a KE etch, performed to remove the final passivation dielectric layer(s) above the metal stack kerf region 132a or pattern 134. In some cases the removal or etching of opening 320, openings 362 and 363; and/or all of remaining resist 310 (e.g. portions 310a-b) is performed by an ash etch, such as using an ionized oxygen gas at a sufficient temperature in a sealed chamber to burn the carbon in the resist 310 sufficiently to remove any remaining resist from the surfaces of the wafer.

In some embodiments, after the KE etch of the dielectric isolation layer 226 and the further dielectric isolation layer 225 to expose top surface of MSK 176 of stack 150 above the metal stack kerf region 132a or pattern 134, FIG. 3C may also include an action to remove KE resist layers 310a, 310b (or any other remaining resist 310) from above layer 226 on wafer 110. In other embodiments, FIG. 3C does not also include an action to remove KE resist layers 310a, 310b (or any other remaining resist 310) from above layer 226 on wafer 110. This removal may be done during a subsequent process, such as during or after wet etch removal of stack 150 (e.g., see FIG. 3D).

In some cases, FIG. 3B-C shows forming a first photoresist layer 310 on the final passivation layers 226 and 225; then performing a photolithographic process to selectively remove the first photoresist layer at locations 320 that are substantially aligned to the lateral dicing pattern 134 of the MSK structure 150; then etching (e.g., using a dry plasma etch) the final passivation layers 226 and 225 at the locations 320 that are substantially aligned to the lateral dicing pattern of the MSK structures due to the photolithographic process; and then removing any remaining locations of the first photoresist layer 310 to expose the un-etched final passivation layer 226.

Figure 3D:
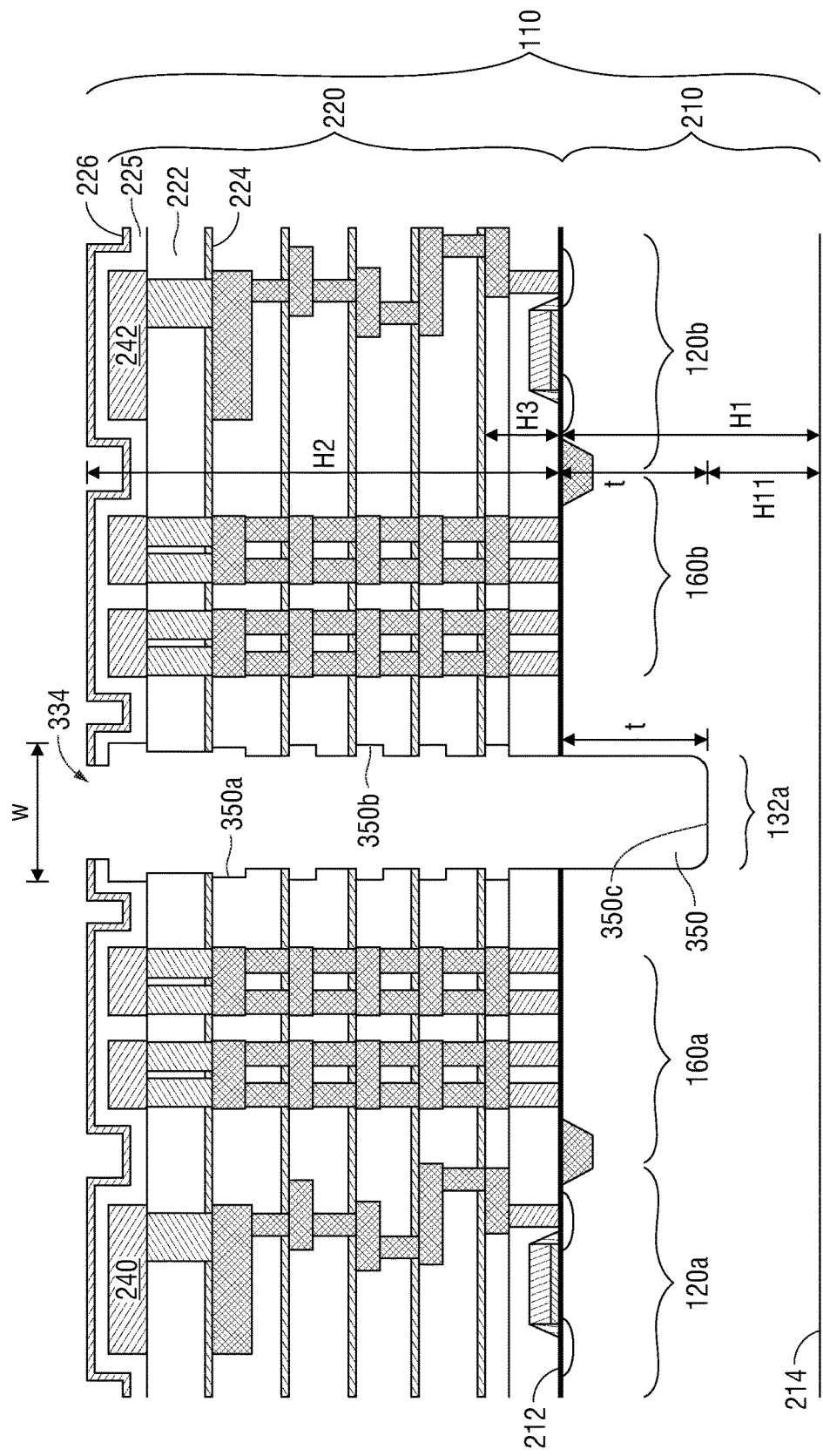

FIG. 3D may show a chemical wet etch of the dicing patter 134 of metal stack MSK structures 150 process performed after a dry etch and resist ash process (e.g., after FIG. 3C) which is used as part of dicing of the chips of wafer 110. FIG. 3D shows MSKs 152-176 of pattern 134 of structures 150 removed or etched away from (e.g., and forming trench pattern 334 of trenches 350) between sidewalls 350a-b and bottom 350c under a top surface (e.g., top of metallization level LV6 or layer M6) of wafer 110. This etch may remove MSKs of structures 150 by etching down through MSK 176, then 174, then 172, then 170, then 168, then 166, then 164, then 162, then 160, then 158, then 156, then 154, then 152 to form a lateral (e.g., horizontal) pattern (e.g., pattern 134 or 334) for dicing the chips (e.g., chips 120a-b) of wafer 110. Trenches 350 or pattern 334 structure may have a depth equal to thickness t. In some cases, the wet etch to form pattern 334 of trenches 350 is an additional wet etch process (e.g., processing "process" or "event") to remove pattern 134 of structures 150, that increases by 1 the number of wet etch processes necessary to complete wafer processing in the "frontend fabrication" of the wafer. However, in many cases, due to the use of wet etching technology, it is a low cost-adder processing process. In most cases, any available depreciated wet etch processing tool available shall have the process capability to perform such a process.

Protective layers 226 may be formed of silicon oxide or glass while 225 may be silicon nitride. In some cases 226 and 225 may be in a suitable dielectric for a protective layer. In some cases they may act as an etch stop, such as to stop the wet etch of FIG. 3D. In some cases they may be blanketed over wafer 310 at all locations where protection is desired, except where electrical contact, such as two pads 240 and 242, is desired, and except where wet etching is desired to etch pattern 134 of structures 150. In some cases, they protect the top surface of the wafer, except at those locations, versus scratching, ionic containment, moisture, and optionally the wet etch of FIG. 3D.

In some cases, an optimized Piranha wet etch process is used to etch away the dicing patter 134 of metal stack MSK structures 150 (e.g., the stack of metals under the opening slit "W" formed during the MSK and the BEOL Processing). In some cases, due to the selectivity of the Piranha etch versus the dielectric layers which encapsulate the metal layers, a well-defined and vertical trenches 350 will be formed (e.g., left-over) surrounding each die or chips of wafer 110 on all of each of their sides. In some cases, (1) the dilution of the Piranha chemistry ($H_2SO_4$:$H_2O_2$:$H_2O$) will be calibrated and (2) the temperature of the dilution will be calibrated in order to achieve the most reliable results for etching away all of structures 150 without etching a minimal amount of dielectric (e.g., of layers 226, 225, 222 (and optionally 224)). In some cases, to prevent undesired underetching of the barrier/stop layers 224, it might also be necessary to modify the chemical formulation of the Piranha bath.

In some cases, experiments can be performed to determine the dilutions factors, the temperature and the buffering of the Piranha solution in order to fine tune the wet etch process to achieve etching away all (or at least 95 percent) of structures 150 to the bottom of thickness t for all (or at least 95 percent) of pattern 134 without etching any (or less than 5 percent) of a thickness of dielectric layers 226, 225, 222 (and optionally 224). In some cases, such calibration or experimentation will depend on the type(s) and thickness of dielectric materials, liners, air gaps, etc. which are specific of the BEOL integration scheme of each wafer technology. In some cases, this will depend on the type(s) and thickness of dielectric materials of layers 226, 225, 222 (and optionally 224), liners (e.g., layer 224 or other liner layers between dielectric layers 226, 225, and/or 222), air gaps (e.g., between or within layers 226, 225, 222 and/or 224), etc.

In some cases, after the optimized Piranha wet etch process the chips or dice are not yet separated from each other because bulk of the wafer (e.g., height H11 of substrate 210) keeps them all together. In some cases, after the optimized Piranha wet etch process the mechanical strength of the wafer (e.g., height H11 of substrate 210) shall allow the physical transportation from frontend wafer processing site to a die-prep assembly processing site.

After the KE etch of the top oxide nitride layer(s) 226/225, FIG. 3D shows an etch action in which the conducting material along pattern 134 of stack 150 is removed from the opening 330 to the bottom of thickness t below first surface 212 of the substrate 210, such as to form trenches 350 having trench pattern 334. This includes removing all of MSKs 152-176 between and including sidewalls 150a and sidewalls 150b from the bottom of thickness t to the top of layer M6, level LV6 or MSK 176.

Therefore, along the vertical kerf-line region 132a or pattern 134 all of structures 150 along pattern 134 can be etched to form trenches 350 having (1) sidewalls 350a facing towards first chip 120a and seal ring 160a and (2) second widthwise or laterally opposing (e.g., along width W) sidewalls 350b facing towards second chip 120b and seal ring 160b. Trenches 350 form trench pattern 334 separating first chip 120a and seal ring 160a from second chip 120b and second seal ring 160b. Trenches may have width W from below thickness t to the top surface of layer 226 along pattern 334.

Figure 3E:
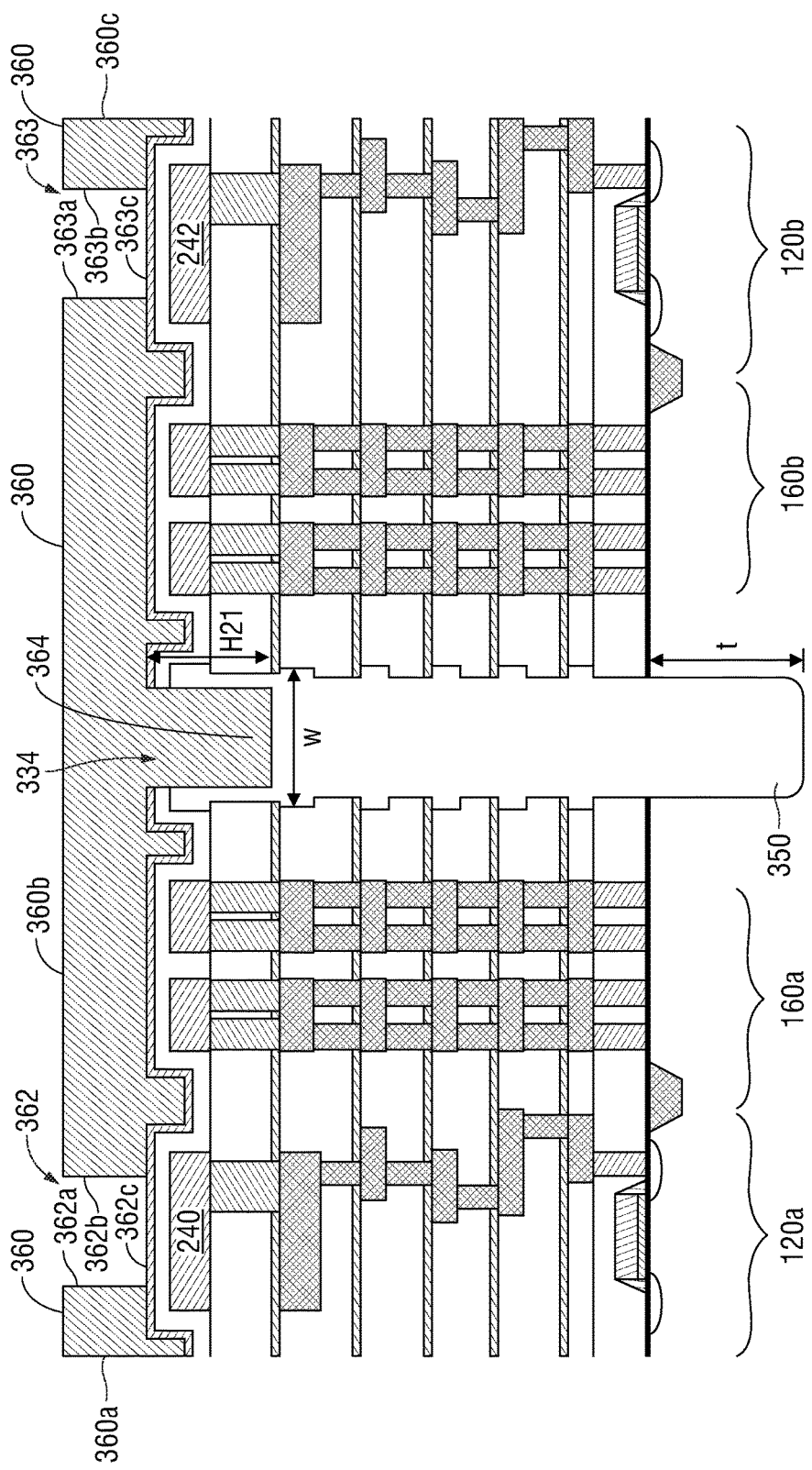
Figure 3F:
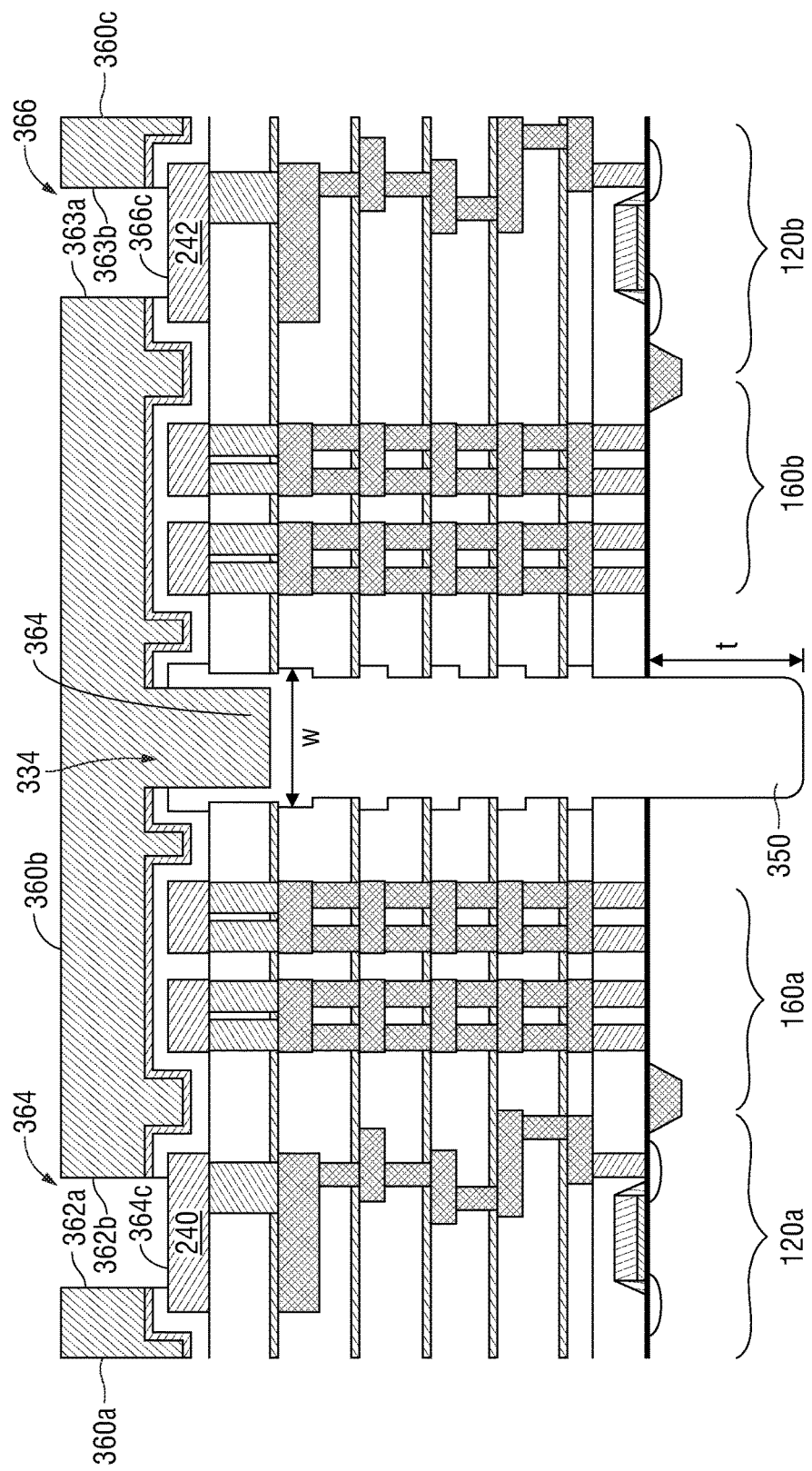
Figure 3G:
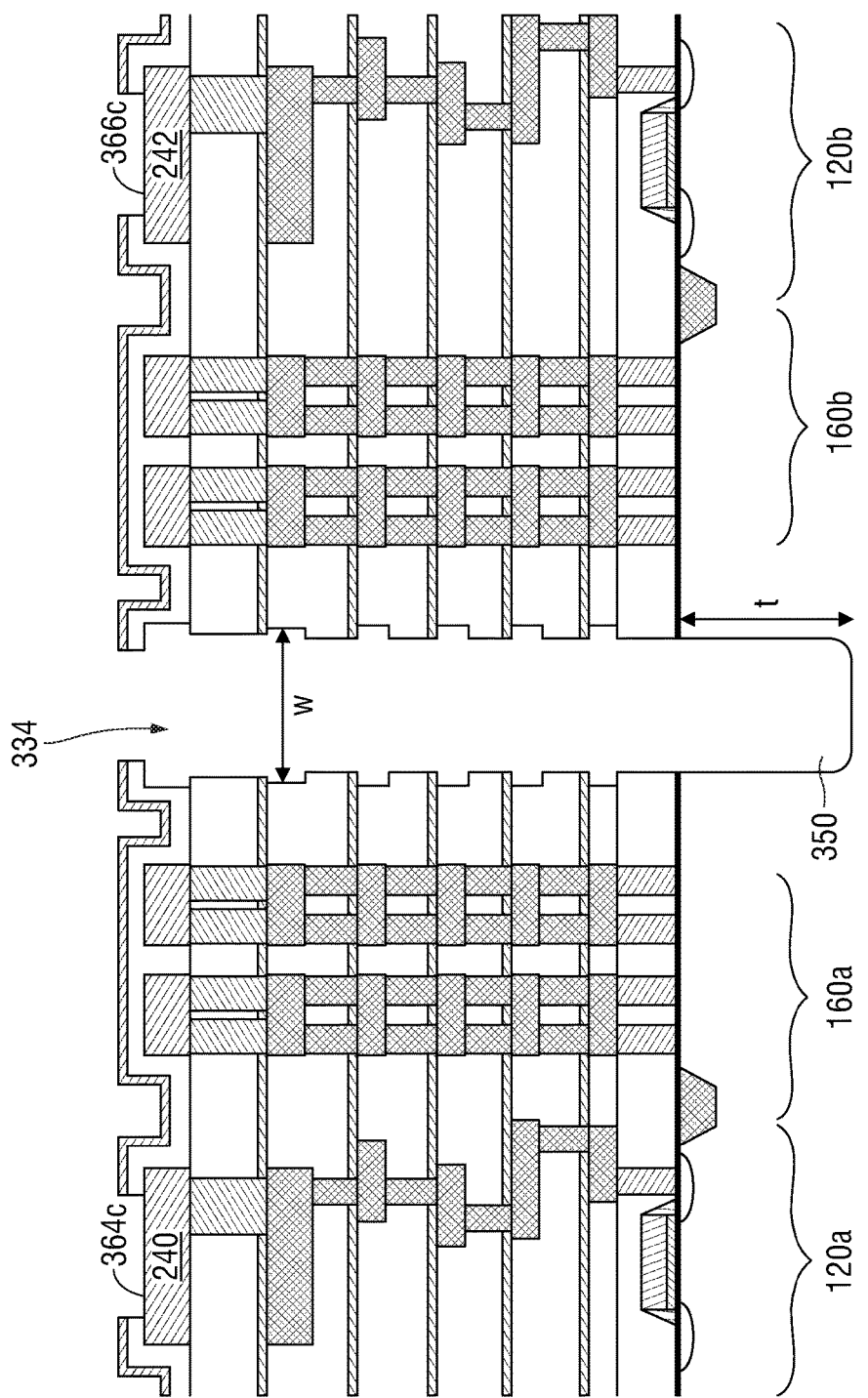
Figure 3H:
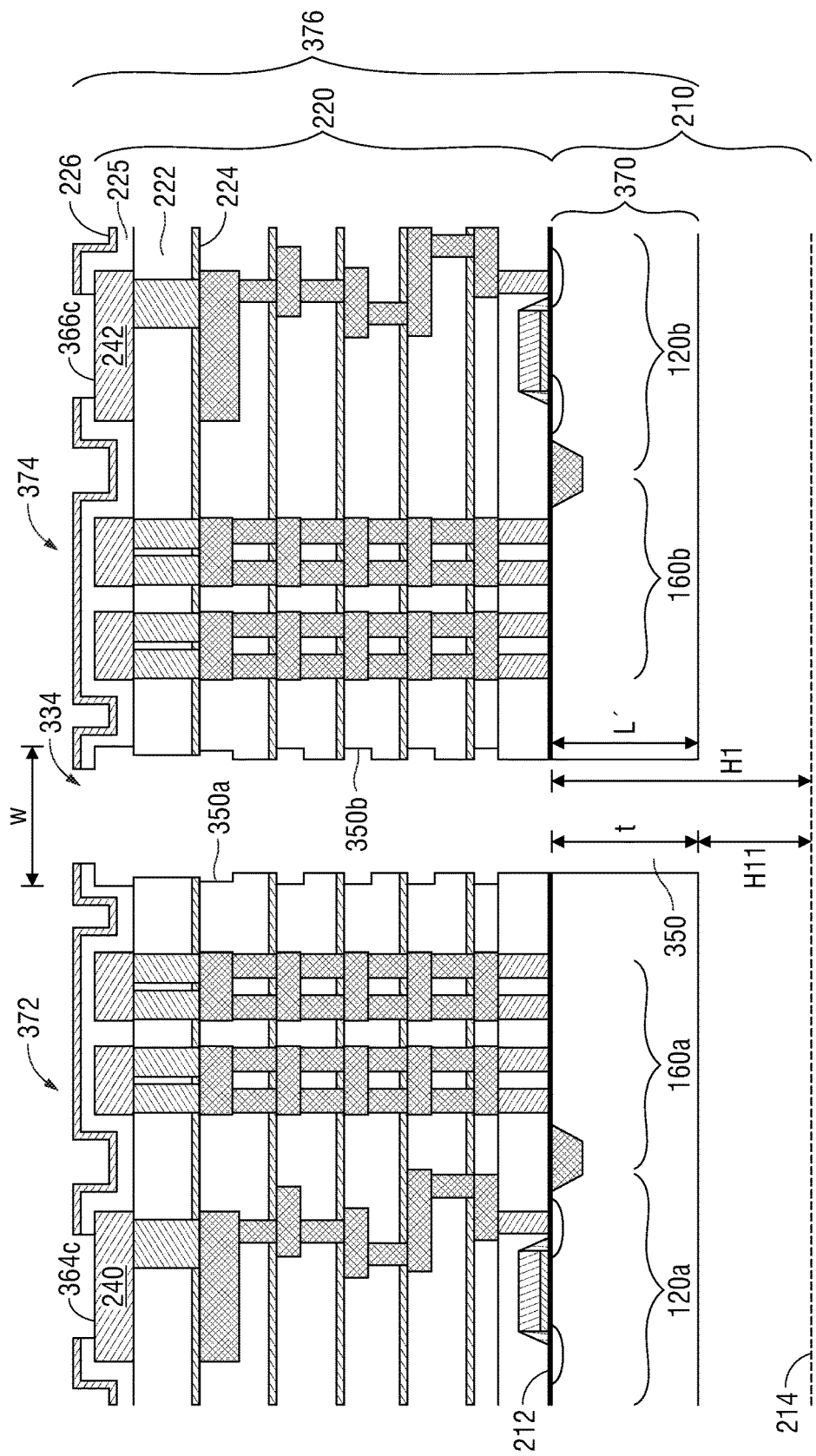

In some cases, trench sidewalls 350a of pattern 334 will form the edges of (and seal rings 120a will seal the edge of) chip 120a, such as to be and seal the edges of the chip 120a diced from wafer 110 after backside grinding (e.g., see FIG. 3H). In some cases, trench sidewalls 350b of pattern 334 will form the edges of (and seal rings 120b will seal the edge of) chip 120b, such as to be and seal the edges of the chip 120b diced from wafer 110 after backside grinding (e.g., see FIG. 3H).

In some cases, thickness t is a distance below surface 212 along trenches 350 forming pattern 334 defined along region 132a or pattern 134. In some cases, once structures 150 is removed, thickness t is a thickness or depth below surface 212 and into substrate 110 of a bottom of lateral chip dicing trench pattern 334 (e.g., where pattern 334 has a top perspective view equal to or corresponding to pattern 134 or region 132a). In some cases, trench structures 350 include a curved trench section; an intersection between two or more trench sections wherein at least one of the trench sections ends at the intersection; or an intersection between two or more trench sections wherein at least one of the trench sections extends in a different direction on the two sides of the intersection.

The process of removing the conducting materials of structures 150 along the vertical kerf-line region 132a and pattern 134 can, for example, comprise a wet etching process. This wet etching process can selectively etch (with respect to not etching dielectric layers 226, 225, 222 and possibly 224) the metallic layers of stack 150 (including M6-M1, the via-contact V1-V5 the contact plug MSK 154 and thickness t of TSV 152), e.g., to depth t below surface 212 of the substrate 210 to remove layers 152-176 of stack 150 to form trenches 350 along pattern 334.

The action of removing the conducting or metal materials of stack 150 can, for example, be or include a wet etch, which is based, for example, on a chemical solution called Piranha, which selectively removes metal and alloys, including those of stack 150. In some embodiments, this Piranha wet etch may remove all of stack 150 along pattern 134 to form trenches 350 along pattern 334.

In some embodiments, this Piranha wet etch may be based on hydrogen peroxide, sulfuric acid and water (e.g., de-ionized water) to selectively etch away the photoresist (comprising, e.g., an organic material) as well as the metal layers of the lateral chip dicing pattern 134 of MSK structures 150 to form a pattern 334 of trenches 350 for dicing the chips of the wafer as desired. In some cases, such a wet etch shall be based on a properly calibrated $H_2SO_4:H_2O_2:H_2O$ solution. Etch rate of metals (or alloys) (e.g., Al, Ag, Au, Ti, Cu, W, TiN, TaN, etc.) typically adopted in semiconductor technology are at least 10 times to 100 times greater than the etch rate of dielectrics of layers 226, 225, 222 (and optionally 224). In some cases this etch has a high etch selectivity of metal of the lateral chip dicing pattern 134 of MSK structures 150 as compared to etch of dielectric 226, 225, 222 and 224 and of substrate 210. In some cases, critical factors to optimize the performance of the Piranha wet etch of metals are expected to be the etch temperature and the relative concentrations of the constituents.

In some cases the calibration of the dilution of the wet etch includes selecting a number of parts of each of water, hydrogen peroxide, and sulfuric acid. This may be considered a rinsing process after the wet etch. In some embodiments a rinsing process is performed after the wet etch to remove any metal or resist residue on the surfaces of the wafer, and in pattern 334 of trenches 350.

In some embodiments, the wet etch is a calibrated mixture of parts of hydrogen peroxide, sulfuric acid, and water at a selected temperature. In some embodiments, the wet etch is a calibrated mixture of parts of another suitable chemical solution capable of selectively etching the adopted materials which make up the metal stack kerf structures 150 as described herein (e.g., at a selected temperature).

This Piranha wet etch may in some cases remove organic photoresists as well as metals. Naturally, other chemical solutions may be applicable as well. In some cases, at the time when etching to remove conducting material of stack 150 inside the opening 330 along the vertical kerf-line region 132a or pattern 134; the KE resist layer 310 (or their parts 310a, 310b, etc.) can also be removed. This Piranha wet etch is possible by appropriately choosing the chemical solution. In some embodiments, this Piranha wet etch may remove all of stack 150 along pattern 134 to form trenches 350 along pattern 334, as well as remove KE resist layers 310a, 310b (or any other remaining resist 310) from above layer 226 on wafer 110.

In some embodiments, this Piranha wet etch may be a wet chemical etch (based on a suitable solution of water-sulfuric acid-hydrogen peroxide, generally denoted as Piranha) to remove the photoresist (e.g., 310a-b) and a full metal stack kerf region 132a or pattern 134 of stack 150. In some embodiments, this Piranha wet etch may be selective to (e.g., not etch or remove) silicon oxide and silicon nitride. As a result, the wafer substrate from the top of layer 226 to the bottom of thickness t along pattern 134 or 334 will be exposed. In other words, while the entire metal stack or pillar structures 150 of pattern 134 is removed, the surrounding oxide (e.g., at the top surface of layer 226; sidewalls 350a-b and bottom surface 350c of trenches 350) is not or only negligible affected (e.g., removed) by the wet etching process.

According to some embodiments, a chemical wet etching process may be used to remove a thickness of structures 150 and form trenches 350 having a depth of H2 plus t of between 0.2 um and 100 um through the top and into the substrate below the devices of the wafer and narrow width w of between 1 and 3 um around the sides of the integrated circuits (e.g., including chips 120a-b) placed on wafer 110, by etching lateral chip dicing pattern 134 of metal through stack of metal stack kerf (MSK) structures 150 of conductor, alloy, and/or metal. By forming trenches 350 followed by a standard wafer backside grinding (e.g., see FIG. 3H), the dicing (or singulation) of each die (e.g., including chips 120a-b) can be performed.

In some embodiments, FIG. 3D shows wet etching the MSK structures 150 by chemically wet etching the through the opening 330 in the final passivation layer 226 obtained, to now expose the depth t below the first main surface 212 of the substrate at the lateral dicing pattern 134 to obtain the trench pattern 334.

In some embodiments, in FIG. 3D, the wet etch may remove resist 310a-b. Consequently, it may be necessary to etch contact openings 364C and 366C (e.g., see FIG. 3F)

after the wet etch. In some embodiments of FIG. 3D, an etch residue cleaning path is performed after the wet etch to clean the remaining resist or residue behind or remaining from the wet etch, such as in pattern 334 of trenches 350.

In some cases, the wet etch can be performed on batch of wafers similar to wafer 310 at the same time (e.g. 10, 25, or 50 wafers) under a wet "hood", such as in a tube tank of solution at approximately 120° C. In some cases each such wafer 110 may include between 300-1500 chips per wafer. In some cases, for very small chips, there may be up to 10,000 chips per wafer, and even more. Thus, it can be seen that the wet etch and backside grinding process can singulate between 3,000 and 300,000 chips in one wet etch process (e.g., followed by backside grinding).

In some embodiments, it is counter intuitive to perform the wet etch of FIG. 3D after forming protective layers 226 and 225 (and especially after forming contact openings to contacts 240 and 242) because this etch would contaminate the wafer metal residue and ions when in the path. Thus, the rinsing process may be formed after the wet etch.

With a depth oft of the trench structure 334 of at least 10 um, the backside grinding of surface 214 of substrate 210 is vertically sufficiently far away from electronic structures 230a, 230b, such as transistors, diodes, etc. that are typically found in the chips 120a, 120b to avoid damage of those structures during the grinding. In this manner, virtually no modification of the electrical properties of the semiconductor devices 230a, 230b will occur during the action of grinding the substrate to dice the chips along pattern 134 or 334.

In some cases, due to forming MSK structures 150 along pattern 134 and then wet etching structures 150, the stack of metals 150 that is etched away to create trenches 350 along pattern 334 can be positioned with the same precision as the semiconductor structures created in the chips 120a, 120b. During the action of grinding the substrate, as will be explained below with respect to FIG. 3H, all of the desired chips can be diced from wafer 110 with the benefits of this process described herein.

In some cases, pattern 134 and 334 are connected and continuous patterns that have each of region 132a separating one chip from another. In some cases they may be disconnected such that each of region 132a separates a chip from a non-chip or sacrificial zone. In some cases they can be the combination of both.

FIG. 3E may show a contact pad opening lithography process performed after the wet etch forms pattern 334 of trenches 350 (e.g., after FIG. 3D) which is used as part of dicing of the chips of wafer 110. FIG. 3E shows resist layer 360 (e.g., a photoresist or mask) formed on or over a top surface (e.g., top of layer 226 and into height H21 of trenches 350) of wafer 110; having opening 362 separating parts 360a and 360b; and having opening 363 separating parts 360b and 360c. FIG. 3E shows plug or pattern 364 (e.g., pattern 134 or 334) of resist layer 360 formed on or into depth or height H21 of trenches 350 along pattern 334. The material of resist 360 may be a photo resist or mask having a thickness of between 2-4 micrometers. In some cases, resist 360 is an organic material.

Opening 362 has sidewalls 362a and 362b exposing top surface 362c of layer 226 above contact pad 240. Pad 240 may be a contact pad upon which a physical and electronic connection can be made such as using a solder bump, to stacks 220 or device 230a of chip 120a. Opening 363 has sidewalls 363a and 363b exposing top surface 363c of layer 226 above contact pad 242. Pad 242 may be a contact pad upon which a physical and electronic connection can be made such as using a solder bump, to stacks 220 or device 230b of chip 120b.

In some cases resist 360 is an organic material that is "spun on" to the surface (e.g. top surface of layer 226) of wafer 110 as a dense liquid. Thus, resist 360 may blanket that surface (1) partially filling into the shapes of the removed topmost MSKs (e.g., between 1 and 4 of the topmost MSKs) of structures 150; (2) filling in between the removed topmost MSKs and any adjacent contact pads; and (3) covering and filling in between the contact pads. The covering and filling may be assisted or caused by resist 360 being pulled downward by gravity when it is spun on or given time to settle. In some cases, some of resist 360 may be pulled by gravity down H21 into pattern 334 of trenches 350 to form plug 364 having pattern 334. Height H21 may be a height of between 2 and 4 micrometers. In some cases, height H21 is between 1 and 10 um. In some cases it is between 2 and 10 um. In some cases it is between 2 and 7 um. In some cases it is between 2 and 5 um. In some cases it is between 2 and 3 um.

In some cases, FIG. 3E is not part of dicing the chips (e.g., chips 120a-b) of wafer 110, but is a process performed between wet etching to form trenches 350 and backside grinding to singulate the chips. In some cases, forming resist layer 360 is standard processing (e.g., processing "process") that does not increase the number of processes necessary to complete wafer processing in the "frontend fabrication" of the wafer.

FIG. 3F may show a contact pad opening dry etch (e.g., dry plasma etch) process performed after the pad opening lithography process (e.g., after FIG. 3E). FIG. 3F shows resist layer 360 (e.g., having parts 360a, b and c)) formed on or over a top surface of wafer 110; and opening 364 separating parts 360a and 360b; and opening 366 separating parts 360b and 360c.

Opening 364 has sidewalls 362a and 362b exposes top surface 364c of contact pad 240. Opening 366 has sidewalls 363a and 363b exposes top surface 366c of contact pad 242. Surfaces 364c and 366c may be surface contacts upon which a physical and electronic connection can be made such as using a solder bump, a wire bonding, etc . . . to stacks 220 or devices 230a-b of chips 120a-b.

In some cases, FIG. 3F is not part of dicing the chips (e.g., chips 120a-b) of wafer 110, but is a process performed between wet etching to form trenches 350 and backside grinding to singulate the chips. In some cases, forming contact pad openings 364 and 366 is standard processing (e.g., processing "process") that does not increases the number of processes necessary to complete wafer processing in the "frontend fabrication" of the wafer.

FIG. 3G may show a contact pad opening resist removal process performed after the contact pad opening, dry etch to expose pads 240 and 242 (e.g., after FIG. 3F). FIG. 3G shows resist layer 360 (e.g., a photoresist or mask) removed from on or over a top surface (e.g., top of layer 226) and height H21 of trenches 350 of wafer 110. Here, parts 360a, b and c; and plug or pattern 364 (e.g., pattern 134 or 334) of resist layer 360 have been etched or removed from depth or height H21 of trenches 350 along pattern 334. In some cases the removal or etching of openings 364 and 366; and/or all of remaining resist 360 (e.g. portions 360a, b and c) is performed by an ash etch, such as using an ionized oxygen gas at a sufficient temperature in a sealed chamber to burn the carbon in the resist 360 sufficiently to remove any remaining resist from the surfaces of the wafer.

FIG. 3G shows trenches 350 along pattern 334 exposed; as well as top surface 364c of contact pad 240 and top surface 366c of contact pad 242.

In some cases, FIG. 3G is not part of dicing the chips (e.g., chips 120a-b) of wafer 110, but is a process performed between wet etching to form trenches 350 and backside grinding to singulate the chips. In some cases, contact pad opening resist removal process is standard processing (e.g., processing "process") that does not increase the number of processes necessary to complete wafer processing in the "frontend fabrication" of the wafer.

According to some embodiments, FIG. 3H may show a wafer "backside" grinding process performed after the contact pad opening resist removal process to remove any remaining resist layer 360 (e.g., after FIG. 3G) which is used as part of dicing of the chips of wafer 110 (e.g., of all the chips that can be or are desired to be diced from wafer 110). In some other embodiments, FIG. 3H may show a wafer backside grinding process performed after the wet etch of structures 150 to form pattern 334 of trenches 350 (e.g., after FIG. 3D), such as where FIGS. 3E-G are not performed, or are performed prior to FIG. 3A and openings 364d and 366c are masked during the wet etch of FIG. 3D.

FIG. 3H shows at least or equal to (e.g., thickness) height H11 ground off of bottom surface 214 of wafer 110, to create substrate 370 from (e.g., as diced sections of) substrate 210 having remaining thickness L'. Substrate 210 is shown with dashed bottom surface 214 where grinding was initiated and continued to grind upwards through at least, or to height H11; grinding through a portion of or to thickness t, which may complete singulation (e.g., separation from each other or all other) of chips or die of wafer 110 (e.g., of all the chips that can be or are desired to be diced from wafer 110).

In some cases, FIG. 3H shows at least thickness or height H11 ground off or away from bottom or "back" surface 214 of wafer 110, to expose pattern 334 of trenches 350, to singulate all of the chips desired to be produced or singulated from wafer 110. In some cases, FIG. 3H shows backside grinding that dices semiconductor wafer into a plurality of adjacent chips, such as by physically grinding away material of the substrate from the bottom main surface to the first surface to expose a bottom of the trench structure, and to singulate the plurality of transistor chips of the wafer. In some cases, FIG. 3H shows grinding a bottom main surface of the substrate opposite to the first main surface with a grinder to remove a thickness of the wafer below and expose the depth below the first main surface of the substrate.

In some cases, FIG. 3H shows at least thickness or height H11 ground off or away from bottom or "back" surface 214 of wafer 110; and through or to bottom surface 350c of pattern 334 of trenches 350, to expose sidewalls 350a as a die edges or sidewalls for chip 372 (e.g., chip 120a now singulated from wafer 110), and to expose sidewalls 350b as a die edges or sidewalls for chip 374 (e.g., chip 120b simultaneously (e.g., with chip 120a) also singulated from wafer 110). In some cases, grinding at least thickness or height H11 includes forming chip 372 having one polygon shape and chip 374 having a different polygon shape (e.g., from a top perspective view of the area of chips 372 and 374 after dicing). In some cases, these two polygon shapes are both non rectangular and non-square.

In some cases, the backside grinding (e.g., FIG. 3H) includes layering or gluing (e.g., typically using an ultraviolet (UV) activated adhesive) a plastic foil across the top of wafer 110 (the foil touching contacts 240 and 242 through openings 364C and 366C and covering pattern 334 of trenches 350), such as using an ultraviolet-UV activated adhesive. This foil will hold the chips during and after grinding, until the adhesive is UV-exposed to allow the diced chips to be removed from the foil.

In some cases, the grinding is performed by forming this plastic foil on a top surface of the wafer, inverting the wafer, and rotating the wafer or an abrasive pad over and contacting surface 214 to "sand away" height H11. In some cases this grinding does not include chemicals, but only includes an abrasive surface contacting surface 214. In some cases, after grinding, the backside of the wafer and exposed trenches 350, along with the plastic foil, are cleaned, such as using water, or a water bath. In some cases, once the grinding and cleaning is complete, the chips are held by the foil, so the wafer can be turned back upright and a machine can be used to soften the glue, and a pickup tool can be used to pick up of each of the chips from the wafer, such as to place them in a package, or as otherwise desired.

After grinding, wafer 110 is now shown as wafer 376, having substrate 370 of thickness L' which is less than or equal to thickness t. In some cases, thickness t sets the height of substrate 370 (or approximately of chips 372 and 374). In some cases it sets the maximum height of substrate 370. In some cases, a predetermined value selected for thickness t (e.g., prior to grinding) sets or determines the height of substrate 370 or maximum height of substrate 370. In some cases, a predetermined value selected for thickness L' (e.g., after grinding) sets or determines the height of substrate 370 or maximum height of substrate 370.

In some cases, after the grinding is performed, it creates (e.g., what remains is) a wafer that has substrate 370; layer stack 220 arranged on a first surface 212 of the substrate, the layer stack comprising at least one conductive interconnection layer LV1; lateral dicing pattern 334 of trench structures 350 extending from depth L' below the first main surface, through a final passivation layer 226 over the layer stack, and to a top surface of the wafer, the lateral dicing pattern 334 laterally between and separating each of a plurality of transistor chips (e.g., chips 372 and 374) formed on the main surface 212; and a backside ground substrate region (e.g., height H11) located between the depth below the first main surface L' and a second surface 214 of the substrate opposite to the first surface. In some cases, after the grinding is performed, what remains includes a foil (not shown) glued to the top surface of the wafer (e.g., at layer 226) that holds the chips (e.g., chips 372 and 374) in place around the trench structures 350 and above the backside ground substrate region.

In some cases, FIG. 3H shows the result of an ensuing thinning process of the wafer 210 from the second surface 214, so that the substrate comprises a thickness L' which is, in general, less than thickness t of the substrate 210 (e.g., of pattern 334 of trenches 350 resulting from wet etch removal of pattern 134 of structures 150 in the previous process). This thinning process to reduce the thickness of the substrate 210 from an initial value H1 to a smaller value L'. Hence, a wafer backside grinding is performed to reduce the wafer substrate thickness to the needed value thickness L'.

Figure 4:
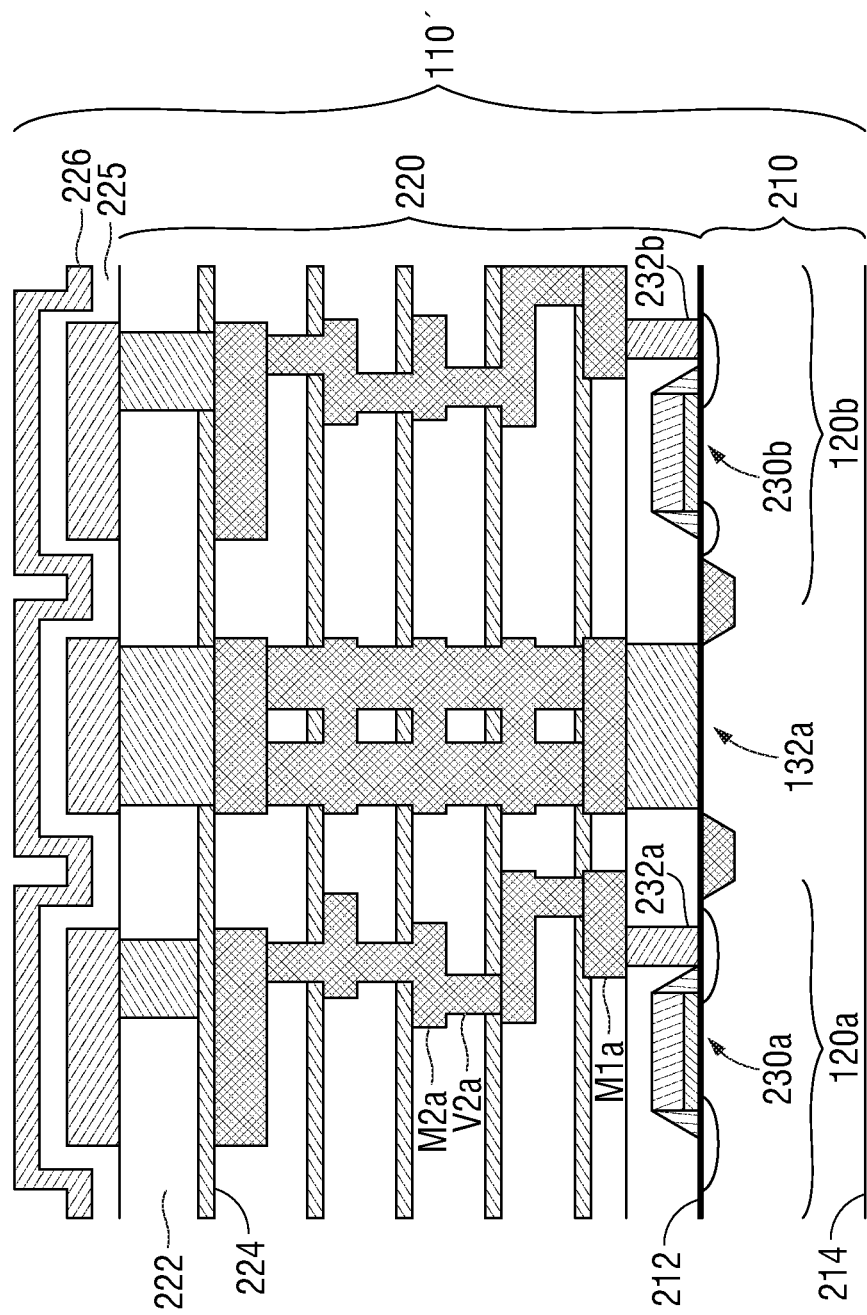
FIG. 4 shows a cross-section of a wafer to be diced and having the seal rings omitted.

FIG. 4 shows a cross-section of a wafer 110 to be diced and having the seal rings omitted. FIG. 4 shows a cross-section of a wafer 110' similar to the cross-section of the wafer 110 shown in FIG. 3A. However, in comparison to the structure shown in FIG. 3A, the total distance between adjacent chips 120a and 120b is further reduced by omitting the seal rings 160a, 160b. As mentioned above, it is possible to obtain very sharp chip sidewalls and the risk of cracking, chipping, pad corrosion or de-lamination of the top layers of the chip is substantially reduced. In some cases, instead of omitting the seal rings 160a, 160b completely, it may also be possible to reduce the lateral dimension of the seal rings, for example, to half of the size of the seal rings 160a, 160b, shown in FIG. 3A.

Some die singulation technologies are based on wafer dicing processes performed by a rotating blade, by laser-assisted scribing or by suitable combinations of the two. Several quality and reliability problems can affect the rotating blade processes: die chipping, die cracks/micro-cracks, discoloration of the die pads, reduced die breaking strengths, etc. Dicing can also be performed by dry plasma etch processes followed by backside grinding. These dicing techniques are essentially single-wafer processes which are affected by low throughput, essentially due to the long etch time required to form deep continuous trenches around the sides of the chips extending through the BEOL oxide stacks and within the bulk of the silicon.

In some cases, the "new" wafer dicing processes described herein (e.g., including wet etching of structures 150 and backside grinding of surface 214) are based on a wet etch (e.g., FIG. 3D) of a physically continuous stack of metal(s) (e.g., structures 150) which surrounds all of the sides of each die and penetrates in the bulk of the wafer for a given depth ("t"). Once the removal of the metal stack 150 by means of the wet etch is completed, a physically continuous grove/trench (e.g., trenches 350) results that surrounds the sides of each die. The subsequent application of a backside grinding process (e.g., FIG. 3H) will result in the singulation of the dice. The original depth t of the grove/trench in the bulk of the silicon wafer can determine the maximum thickness of the singulated die.

It can be appreciated that the "new" wafer dicing processes described herein do not require ultraviolet radiation, cracking, or breaking of the chips from each other, from the substrate, or from the wafer. It can be appreciated that the processes above do not require a high power ablation laser which is expensive and has a slow throughput. It can be appreciated that the processes described provide dicing without thermal expansion issues encountered when using a laser or ultra violet light during a dicing process.

In some cases, the "new" wafer dicing processes described herein (e.g., including wet etching of structures 150 and backside grinding of surface 214) are not limited to square or rectangular chip shapes or to rectangular singulation lines extending across the entire wafer (e.g., in contrast to mechanical blade dicing). Instead, chips of all shapes (e.g., from a top perspective view of the area of chips 372 and 374 after dicing) can be singulated, especially if the wafer dicing processes described herein are modified to support arbitrary shapes of the singulation lines. In some cases, the new wafer dicing processes described herein provide dicing of chips of any shape (e.g., hexagonal, star-like, U-shaped, triangle-shaped, half-moon shaped, etc.), other than the rectangular/squared classical die shapes. In some cases, wafer dicing processes described herein provide dicing of chips of various shapes such as those that form a polygon perimeter (e.g., the perimeter defined by the edges of the polygon shaped chip) or polygon curve line region around a chip, or a polygon shaped chip. This ability to dice various shapes is capable of accommodating specific die form factors of future products (e.g., internet of things—IOT chips) or enabling optimized signal integrity when connecting two (or more) dice.

Also, the new wafer dicing processes described herein can provide singulation of every single die (e.g., all the chips that can be or are desired to be diced from wafer 110) in a shared reticle (e.g., multi product shuttles) even if, due to different (x, y) dimensions of the dice and different dimensions of kerfs, the dice are not aligned to each other. Exploiting the wafer dicing processes described herein, it is possible for no dice on the wafer to be destroyed (e.g., as it would happen when a rotating blade dicing approach would be utilized). Therefore, the logistic of the chip sampling process during wafer fabrication and dicing can be optimized (less wafers to sample the same number of chips). In some cases, wafer dicing processes described herein can use a "shared reticle" by using the same mask or reticle for dicing of different sized and shaped chips from a single wafer.

The new wafer dicing processes described herein can result in a high dicing quality (e.g., of all the chips that can be or are desired to be diced from wafer 110) in a shared reticle (e.g., multi product shuttles). To mention some important figures of merit: very sharp chip sidewalls (e.g., sidewalls 350a of diced chip 372 and 350b of chip 374 after dicing which were formed in pattern 334 of trenches 350), virtually no cracks, virtually no chipping, virtually no pad corrosion, no wafer dust on chip surface, virtually no delamination of the top layers of the chip. The wafer dicing processes described herein can result in an improvement of the wafer dicing quality and of the key die prep quality characteristics such as: die breaking strengths; die chippings; ultrathin die; crack-free process; and/or ultrathin metallization layer and via layer structure process. These improvements in dicing quality can result from dicing by wet etching and backside grinding as opposed to requiring a physical breaking of die from the wafer, such as required for prior laser dicing.

The new wafer dicing process described herein can result in minimization of the cost per chip by maximizing the silicon utilization of the semiconductor wafers through a drastic reduction of the width of the scribe-line (kerf line) (e.g., width W of pattern 134 or 334) which separates adjacent integrated circuits (chips) (e.g., see FIGS. 2B-C). In some cases, the smaller the die size (e.g., in the range of 1×1 $mm^2$, 2×2 $mm^2$), the higher the cost saving will be. In some cases, a high utilization percentage of wafer area is achieved, especially when the kerf width W is reduced to less than or equal to 2 um. The new wafer dicing processes described herein can result in the increase of the "Net Silicon Utilization" (e.g., more "Dice-Per-Wafer").

The new wafer dicing processes described herein can result in cost reduction of the overall die prep flow (e.g., of all the chips that can be or are desired to be diced from one or more of wafers 110), especially for those classes of products (e.g., chips 120a-b) that by default make use of metallization layer, via layer structure and through silicon via technology. In some cases, since no critical dimensional control is required to perform the needed wafer dicing operations, one benefit of the teachings disclosed herein consists in the fact that the necessary tools (e.g., see FIGS. 3B-D and 3H) do not need to be particularly advanced (at least, with respect to the current technological status). In some cases, the tools could be fully depreciated, therefore minimizing the manufacturing costs of the operations.

In some cases, wafers that require (e.g., per default) the use of metallization layer and via layer structure technology or processing to form the chip device or metallization levels of the wafers will benefit from a reduced increment in wafer processing costs due being able to dice the chips from the wafer with only the additional, relatively low cost of adding costs for processing such as shown for FIGS. 3A-D. In some cases, wafers which do not requires metallization layer and via layer structure technology or processing to form the chip device or metallization levels of the wafers as a standard process loop, the additional costs of the metallization layer and via layer structure processing to form pattern 134 of structures 150 can be added to the added costs for processing such as shown for FIGS. 3A-D. In either case, the utilization of forming pattern 134 of structures 150, and processing such as shown for FIGS. 3A-D will highly increase the throughput of die processing when it comes to dicing (die prep); therefore, reducing the overall costs.

The new wafer dicing processes described herein can result in higher throughput (e.g., of all the chips that can be or are desired to be diced from one or more of wafers 110) in comparison to the classical rotating blade dicing or laser scribing or arrangements for dicing. In some cases, the new wafer dicing processes described herein are much faster at dicing wafers as compared to using a laser which is significantly slower than the processing herein since a laser typically is only able to "saw" along one line or form one trench at a time. Similarly, dicing using a blade is only capable of dicing along a straight line and typically along straight lines that are perpendicular to each other, one at a time. On the other hand, the new wafer dicing processes described herein can be used to die up to 25 or 50 wafers in one batch (e.g. by performing the process for FIGS. 3A-3H) due to one or more wafers being capable of having pattern 334 formed for the entire wafer(s), at the same time, in a single wet etch bath, and then each wafer being backside grinded to dice the wafer(s) (e.g., to dice all the chips that can be or are desired to be diced from one or more of wafers 110).

In some cases, the new wafer dicing processes described herein result in short etch times to remove the metal stack structures 150 as a consequence of the intrinsic properties of the Piranha wet etch of metals of that stack. In some cases, the new wafer dicing processes described herein result in high wafer throughput, as a consequence of the batch-based wet etch process. Typical batch size can be as large as 50 wafers, leading to an enormous improvement with respect to typical rotating blades or laser assisted dicing throughput figures (essentially, single-wafer tools). Furthermore, the relative relaxed requirements on the necessary wet etch technology can lead to reduced cost of ownership figures of the wet etch tools.

In some cases, for a wafer diced using the "new" wafer dicing processes described herein, when the width W of the scribe line is reduced to only a few microns, it may become desired (or even necessary) to properly relocate the process monitoring structures (known also as process control monitors, PCM) normally placed in the scribe lines. In some cases, the PCMs may include hundreds of physical and electronic structures to monitor or test the chips or wafer during fabrication. Some embodiments of the "new" wafer dicing processes described herein include rearranging (e.g., moving) the PCM in the area of one or more chips; consequently, a given numbers of dice will be lost. In some cases, this is an unexpected and undesirable rearrangement.

FIG. 5 shows an example of a process control monitor (PCM) relocation strategy for relocating scribe lines of one wafer to be diced to the area of one or more chips of a different wafer to be diced. FIG. 5 shows an example of PCM relocation 500 from scribe lines of wafer 510 to the area of one or more chips of wafer 530. FIG. 5 shows an example PCM kerf structures located in horizontal scribe lines 502 and PCM kerf structures located in horizontal scribe lines 504 being relocated from wafer 510 which is to be diced using a classical technology (e.g., blade and/or laser) to wafer 530 which is diced using the "new" wafer dicing process described herein. Here, they are shown relocated to the top perspective view area of two chips of a wafer. Depending on several factors (e.g., die size, PCM dimensions, number of PCM absolutely required to properly monitor the manufacturing/test process, etc.), the number of lost dice might be greater than only two (as only for illustration purposes is depicted in FIG. 5).

In some cases, in FIG. 5, chips 520*a, b* and *c* of wafer 510 are shown in the grid "X" locations, separated by the wider scribe lines 512 and 514 of the array area that is part of the wafer; and chips 530*b* of wafer 530 are shown in the grid "X" locations, separated by the more narrow scribe lines 532 and 534 of the array area that is part of the wafer. The PCMs are used during chip fabrication to monitor the success or failure of the processing processes. In some cases of wafer 510, the PCMs are 30 to 40 um wide which can also be the width of the dicing blades or lasers, which destroy the PCMs during dicing. In some cases of wafer 510, the PCM width is between 30 and 60 mm wide, and dicing destroys the silicon area of all of the PCM and kerf lines on the wafer. In some embodiments of wafer 530, that use a wet etch with a backside grind as described herein, the PCMs are moved as shown in wafer 530, so that the horizontal and vertical kerf structures are lumped together in the space of one or more die locations on the wafer.

FIG. 5 shows an example PCM kerf structures located in horizontal scribe lines 502 and PCM kerf structures located in horizontal scribe lines 504 being relocated from wafer 510 which is to be diced using a classical technology (e.g., blade and/or laser) to wafer 530 which is diced using the "new" wafer dicing process described herein.

FIG. 5 shows wafer 510 having PCM kerf structures located in horizontal scribe lines 502 located in horizontal scribe lines 512 between chips 520*a, b* and *c*; and PCM kerf structures located in vertical scribe lines 504 located in vertical scribe lines 514 between chips 520*a, b* and *c*. FIG. 5 shows wafer 530 having PCM kerf structures located in horizontal scribe lines 502 relocated in chip 530*a* (e.g., not located or fitting in horizontal scribe lines 532 between chips 530*b*); and PCM kerf structures located in vertical scribe lines 504 relocated in chip 530*c* (e.g., and not located or fitting in horizontal scribe lines 534 between chips 530*b*).

In some cases, for wafer 510, due to the spatial resolution of the classical rotating blade dicing technology (assisted or not by laser scribing), dice 520*a-c* must be separated by each other by a dicing streets 512 and 514 (known also as scribe line, dicing channel, etc.), whose width can be as wide as 160 um.

In some cases, for wafer 530, for the "new" wafer dicing processes described herein, the separation width W of dicing streets 532 and 534 between dice can be reduced to a few microns only, e.g. 2-10 um. Consequently, the smaller the area of the die, the higher the number of dice that can be placed on a wafer. This leads to an increased "net silicon utilization" or, conversely, to a lower die cost. Based on one example simulation model (e.g., see FIGS. 2B-C), one possible best increase in "net silicon utilization" is achieved for dice whose area is below 2×2 mm$^2$.

In some cases, each of chips 530*b* represent an example of one of chips 120*a* or 120*b*; scribe lines 532 and 534 represent an example of pattern 134 of structures 150 or pattern 334 or trenches 350; and wafer 530 represents an example of wafer 110.

In some cases, all of chips 530*a, b* and *c* will be diced from wafer 530. In some cases, only chips 530*b* will be diced from wafer 530 (e.g., chips 530*a* and 530*c* are not desired chips for production or sale). It can be appreciated that although wafers 510 and 530 are only shown with a 4×4 array of chips, such a wafer can contain hundreds or several hundred such chips.

In some cases, the "new" wafer dicing process described herein (e.g., including wet etching of structures 150 and backside grinding of surface 214) provide the benefits embodied in computer system architecture features and interfaces made in high volumes. In some cases, the "new" wafer dicing processes described herein may be used by semiconductor manufacturing companies, such as foundries and integrated device manufacturers (IDM). In some cases they may be used by high volume architecture manufacturers; or may be embodied in computer system architecture features and interfaces made in high volumes.

In some cases they may be used to satisfy the continuous demand for dicing/diced chips requiring higher speed input/outputs (IOs), more sophisticated and complex system-on-a-chips (SoCs), more advanced multi-chip packaging, stringent requirements on the signal and power integrity (SPI) figures. For instance, when connecting one or more memory chip(s) to a communication processor/application processor SoC chip (CP/AP) in a multichip packaging, the signal and power integrity (SPI) figures could be more easily optimized if, for instance, one would have the CP/AP shaped as a "U" shape; and the memory chip(s) mounted in the center of the U and wire bonded to the surrounding U shaped CP/AP. This would allow for high speed and shorter signal routing (such as through wire bonding) between the memory chip(s) and the U shaped CP/AP.

In some cases, the "new" wafer dicing processes described herein (e.g., including wet etching of structures 150 and backside grinding of surface 214) can be evidenced or detected (e.g., including whether the process or resulting chips were successfully diced) using: (1) a proper inspection of the edges of the chips (e.g., using an electron microscope); (2) if the shape of the chips were not be square or rectangular (e.g. were another shape of polygon). Such as proper inspection may detect that (1) the upper region of the sidewall (e.g., sidewall 350*a* or *b*) of the substrate 370 corresponding to the former trench structure 350 is substantially flush with a sidewall of the layer stack 220; (2) the sharpness of the vertical edges (e.g., sidewall 350*a* orb) of the chips is a sign that no classical mechanical sawing (blade dicing) has been utilized; (3) that the back-end-of-line stack 220 reveals a kind of zigzag profile, sign of the original presence of the wet etch of structures 150 (see, for example, FIG. 3D). In some cases, they can be evidenced or detected by a proper inspection (e.g., scanning electron microscope—SEM) of the vertical edges 350*a-b* in trench 350 of structure 372 and/or 374, which after backside grinding and chip singulation may be high as t. This inspection may detect the typical "scalloped" edge profiles of the silicon or other material of substrate 370 showing an indication that a TSV etch process (possibly based on a so-called Bosch Etch process) previously occurred in trench 350 of structure 372 and/or 374 (e.g., to form the scalloped edge profiles of edges 350*a-b* in trench 350). For instance, prior to forming TSVs 152-154, an etch through thickness t of substrate 210 may have been performed to form a trench into which TSVs 152-154 would be formed (e.g., deposited or grown, having edges 150*a-b*) of structure 150. After the processes of FIGS. 3A-H (e.g., singulation of chips 372 and 374), a proper inspection (e.g., scanning electron microscope—SEM) of the vertical edges 350*a-b* (previously edges 150*a-b*) in trench 350 of structure 372 and/or 374, may detect the typical "scalloped" edge profiles of the silicon or other material of substrate 370 (previously 270) showing an indication that a TSV etch process (possibly based on a so-called Bosch Etch process) occurred to from the trench into which TSVs 152-154 were formed (e.g., as shown in FIG. 3A).

In some cases, the use of "approximately" describes exactly that number. In some cases, the use of "approximately" describes within 10 percent above and below that number. In some cases, the use of "approximately" describes within 5 percent above and below that number. In some cases, the use of "approximately" describes within 2 percent above and below that number.

According to embodiments chips 120*a-b* may each be an IC chip such as microprocessor, coprocessor, graphics processor, memory chip, modem chip, or other microelectronic or electromechanical (MEMs) chip devices. According to embodiments, chips 120*a-b* may each be an IC chip capable of being mounted or directly attached onto a socket, an interposer, a motherboard, or another next-level component.

In some embodiments, MSK layers 152-176 (e.g., of pattern 134 of structures 150) are formed of a solid conductive (e.g., pure conductor) material. In some cases, they may each be a height (e.g., a thickness), width and length (such as shown and described herein) of solid conductor material. In some cases, the conductive (e.g., conductor) material may be a pure conductor (e.g., a metal or pure conductive material). Such material may be or include copper (Cu), gold, silver, bronze, nickel, silver, aluminum, molybdenum, an alloy, or the like as known for such a contact. In some cases, they are all copper. In some cases, they all include copper and may include one or more other metals.

In some cases, MSK layers 152-176 (e.g., of pattern 134 of structures 150) are formed using processes or processing as known in the industry for forming traces, interconnects, metallization layers, via layers, via contacts and/or TSVs of an IC chip or die. In some cases, forming them includes using masking and etching of a silicon wafer. In some cases, the masking includes masking with a solder resist and etching dielectric and/or conductor material. In some cases, forming them includes using chemical vapor deposition (CVD); atomic layer deposition (ALD); growing dielectric material such as from or on a surface having a pattern of dielectric material and conductor material. In some cases, forming them includes patterning a mask using photolithography to form layers of metallization layer and via layer structure (e.g., such as MSK structures 150) upon one another. In some cases, the mask may be liquid photoimageable "wet" mask or a dry film photoimageable "dry" mask blanket layer sprayed onto the surface; and then masked and exposed to a pattern of light (e.g., the mask is exposed to light where a template of the pattern placed over the mask does not block the light) and developed to form openings where the features will exists. Depending on the mask type, the exposed or unexposed areas are removed. In some cases, the mask goes through a thermal cure of some type after the openings (e.g., pattern) are defined. In some cases, the mask may be formed by a process known to form such a mask of a chip, or device formed using IC chip processing.

In some cases, layers of dielectric material 226, 225, 222 (and optionally 224) may each be a height (e.g., a thickness), width and length of solid non-conductive material. In some cases, the dielectric material may be a pure non-conductor (e.g., an oxide or pure non-conductive material). Such material may be or include silicon nitride, silicon dioxide, porcelain, glass, plastic, or the like as known for such a dielectric. In some cases it is silicon nitride. In some cases, it is a pure oxide, non-conductive material.

In some cases, layers of dielectric material 226, 225, 222 (and optionally 224) fill in any space between (e.g., above, below, and beside such as in the length, width and height directions) the other wafer metal, metallization layer, via layer, TSV, device and STI structures or features. In some cases, filling in the space between the interconnect features includes these dielectric materials existing in any space where those or other features of chips 120*a*-*b* do not exist, and are not physically attached to (e.g., are not touching) each other, such as shown in the Figures. In some cases, filling in the space between the interconnect features includes these dielectric separating each and all of those features except where they are coupled or physically attached to each other. In some cases, filling in the space between the interconnect features includes these dielectric materials existing in any space where those features do not exist, are not coupled to each other, and are not physically attached to each other, except where other circuitry, traces, contacts exist, such as is known.

Figure 6:
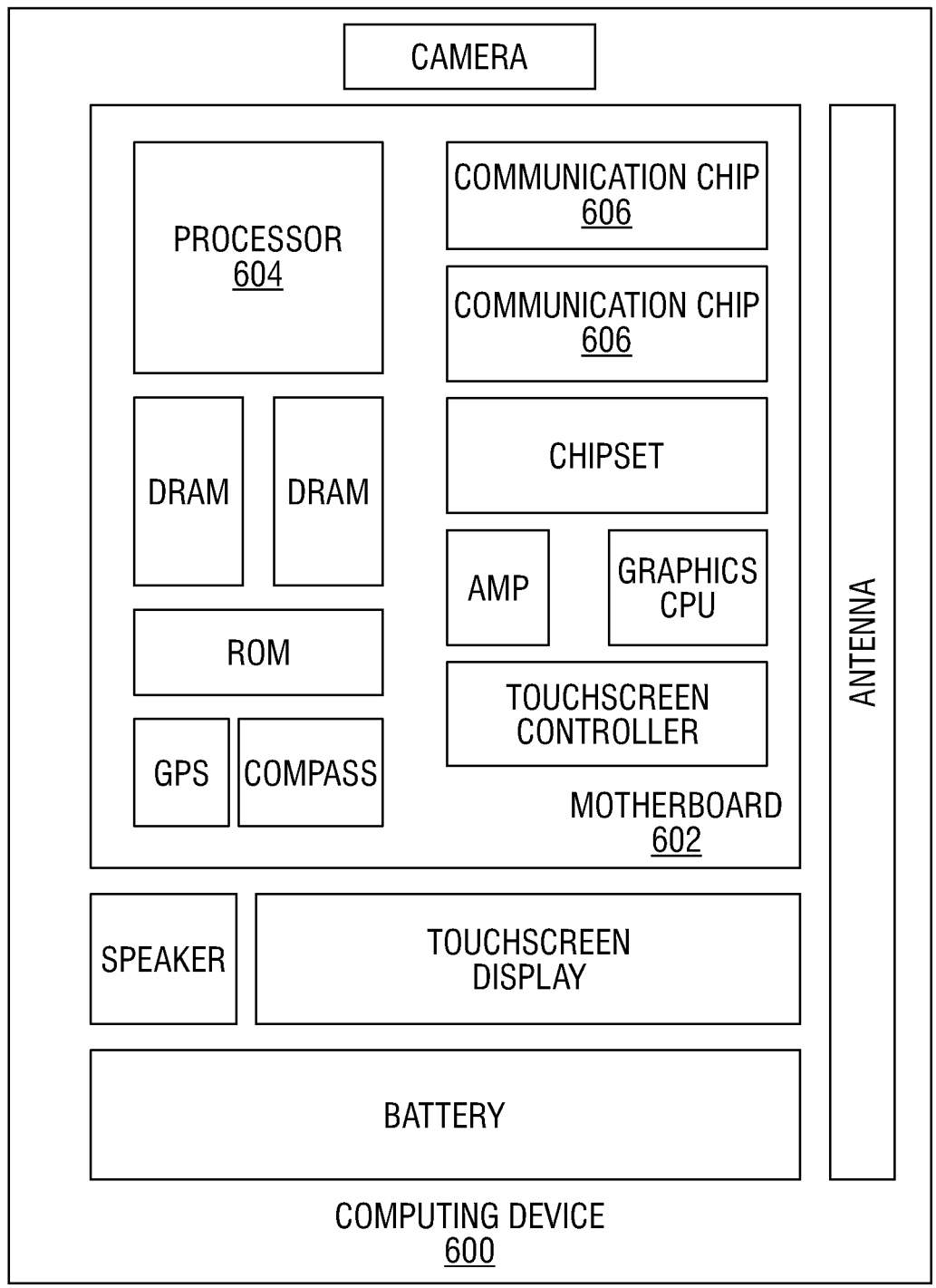
FIG. 6 illustrates a computing device in accordance with one implementation.

FIG. 6 illustrates a computing device in accordance with one implementation. FIG. 6 illustrates computing device 600 in accordance with one implementation. Computing device 600 houses board 602. Board 602 may include a number of components, including but not limited to processor 604 and at least one communication chip 606. Processor 604 is physically and electrically coupled to board 602. In some implementations at least one communication chip 606 is also physically and electrically coupled to board 602. In further implementations, communication chip 606 is part of processor 604.

Depending on its applications, computing device 600 may include other components that may or may not be physically and electrically coupled to board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, first communication chip 606 may be dedicated to shorter range wireless communications such as Wi-Fi and Bluetooth and second communication chip 606 may be dedicated to longer range wireless communications such as GPS, EDGE, GPRS, CDMA, WiMAX, LTE, Ev-DO, and others.

Processor 604 of computing device 600 includes an integrated circuit die packaged within processor 604. In some implementations, the integrated circuit die of the processor includes one or more devices, such as transistors or metal interconnects. In some embodiments, integrated circuit die or processor 604 includes embodiments of one or more chips diced using the "new" wafer dicing processes described herein (e.g., including wet etching of structures 150 and backside grinding of surface 214). The term "processor" may refer to any device or portion of a device that processes electronic data from registers and/or memory to transform that electronic data into other electronic data that may be stored in registers and/or memory.

Communication chip 606 also includes an integrated circuit die packaged within communication chip 606. In accordance with another implementation, the integrated circuit die of the communication chip includes one or more devices, such as transistors or metal interconnects. In some embodiments, the integrated circuit die or chip 606 includes embodiments of one or more chips diced using the "new" wafer dicing processes described herein (e.g., including wet etching of structures 150 and backside grinding of surface 214).

In further implementations, another component housed within computing device 600 may contain an integrated circuit die that includes one or more devices, such as transistors or metal interconnects. In some embodiments, the other integrated circuit die or chip includes embodiments of one or more chips diced using the "new" wafer dicing processes described herein (e.g., including wet etching of structures 150 and backside grinding of surface 214).

In various implementations, computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 600 may be any other electronic device that processes data.

EXAMPLES

The following examples pertain to embodiments.

Example 1 is a method of dicing a semiconductor wafer, the method comprising: forming vertically stacked metal stack kerf (MSK) structures in an intended lateral chip dicing pattern; wherein forming includes forming from a depth below an upper surface of a substrate of the wafer, up through metallization layers of the wafer, to protective layers on a top surface of the wafer; etching the protective layers to expose the vertically stacked metal stack kerf (MSK) structures along the intended lateral chip dicing pattern; wet etching the vertically stacked metal stack kerf (MSK) structures along the intended lateral chip dicing pattern to form a lateral chip dicing trench pattern to the depth below the upper surface of the substrate along the intended lateral dicing pattern; and backside grinding a lower surface of the substrate to expose the depth below the upper surface of the substrate along the intended lateral dicing pattern.

In Example 2, the subject matter of Example 1 can optionally include wherein backside grinding dices the semiconductor wafer into a plurality of adjacent chips.

In Example 3, the subject matter of Example 1 can optionally include wherein grinding includes physically grinding away material of the substrate from the bottom main surface to the first surface to expose a bottom of the trench structure, and to singulate the plurality of transistor chips of the wafer.

In Example 4, the subject matter of Example 1 can optionally include wherein the lateral dicing pattern of the metal stack kerf (MSK) structure is laterally disposed between seal rings of adjacent chips of the semiconductor wafer.

In Example 5, the subject matter of Example 1 can optionally include wherein etching the final passivation layer comprises: forming a first photoresist layer on the final passivation layer; performing a photolithographic process to selectively remove the first photoresist layer at locations that are substantially aligned to the lateral dicing pattern of the metal stack kerf (MSK) structure; etching the final passivation layer at the locations that are substantially aligned to the lateral dicing pattern of the metal stack kerf (MSK) structures due to the photolithographic process; and removing any remaining locations of the first photoresist layer to expose the un-etched final passivation layer.

In Example 6, the subject matter of Example 1 can optionally include wherein etching the final passivation layer comprises a dry plasma etching of the final passivation layer through the location that is substantially aligned to the lateral dicing pattern of the metal stack kerf (MSK) structures.

In Example 7, the subject matter of Example 1 can optionally include wherein wet etching the metal stack kerf (MSK) structures comprises chemically wet etching through the opening in the final passivation layer obtained to expose the depth below the first main surface of the substrate at the lateral dicing pattern to obtain the trench pattern.

In Example 8, the subject matter of Example 7 can optionally include wherein the wet etch is a calibrated mixture of parts of hydrogen peroxide, sulfuric acid, and water at a selected temperature.

In Example 9, the subject matter of Example 1 can optionally include wherein the depth below the first main surface is between a-few tens of micrometers up to a few hundreds of micrometers ("um") and wherein etching the metal stack kerf (MSK) structures produces the trench structures having a width of between 1 um and 10 um.

Example 10 is a method of dicing a semiconductor wafer, the method comprising: forming a lateral dicing pattern of metal stack kerf (MSK) structures to a depth below a first main surface of a wafer substrate of the wafer, the lateral dicing pattern laterally between and separating each of a plurality of transistor chips formed on the main surface; forming a final passivation layer over the MSK structures and a top surface of the wafer; etching the final passivation layer to expose the lateral dicing pattern of the MSK structure; wet etching the lateral dicing pattern of the metal stack kerf (MSK) structures through the etched final passivation layer to form a trench structure in the substrate that extends to the depth below the first main surface of a substrate; and grinding a bottom main surface of the substrate opposite to the first main surface with a grinder to remove a thickness of the wafer below and expose the depth below the first main surface of the substrate.

In Example 11, the subject matter of Example 10 can optionally include wherein grinding includes physically grinding away material of the substrate from the bottom main surface to the first surface to expose a bottom of the trench structure, and to singulate the plurality of transistor chips of the wafer.

In Example 12, the subject matter of Example 10 can optionally include wherein etching the final passivation layer comprises a dry plasma etching of the final passivation layer through the location that is substantially aligned to the lateral dicing pattern of the metal stack kerf (MSK) structure.

In Example 13, the subject matter of Example 12 can optionally include wherein etching the final passivation layer comprises: forming a first photoresist layer on the final passivation layer; performing a photolithographic process to selectively remove the first photoresist layer at locations that are substantially aligned to the lateral dicing pattern of the metal stack kerf (MSK) structure; etching the final passivation layer at the locations that are substantially aligned to the lateral dicing pattern of the metal stack kerf (MSK) structures due to the photolithographic process; and removing any remaining locations of the first photoresist layer to expose the un-etched final passivation layer.

In example 14, the subject matter of Example 10 can optionally include, further comprising: prior to grinding, forming a second photoresist layer on the final passivation layer and a top thickness of the trench structure; performing a photolithographic process to selectively remove the second photoresist layer at contact locations that are substantially aligned to contact pads disposed under the final passivation layer; etching the final passivation layer at the contact locations due to the photolithographic process; and removing any remaining locations of the second photoresist layer to expose the un-etched and the trench structure.

In Example 15, the subject matter of Example 10 can optionally include wherein wet etching the metal stack kerf (MSK) structures comprises chemically wet etching the through the opening in the final passivation layer obtained to expose the depth below the first main surface of the substrate at the lateral dicing pattern to obtain the trench structure.

In Example 16, the subject matter of Example 15 can optionally include wherein the wet etch is based on at least one of hydrogen peroxide, sulfuric acid, and/or de-ionized water.

In Example 17, the subject matter of Example 10 can optionally include wherein forming the lateral dicing pattern of metal stack kerf (MSK) structures comprises forming a plurality of loops that laterally enclose the plurality of transistor chips of the wafer; and wherein the lateral dicing pattern of the metal stack kerf (MSK) structure is laterally disposed between seal rings of adjacent chips of the semiconductor wafer.

In Example 18, the subject matter of Example 10 can optionally include wherein the depth below the first main surface is between a few tens of micrometers up to a few hundreds of micrometers ("um"); and etching the metal stack kerf (MSK) structures produces the trench structures having a width of between 1 um and 10 um.

Example 19 is a wafer comprising: a substrate; a layer stack arranged on a first surface of the substrate, the layer stack comprising at least one conductive interconnection layer; a lateral dicing pattern of trench structures extending from a depth below the first main surface, through a final passivation layer over the layer stack, and to a top surface of the wafer, the lateral dicing pattern laterally between and separating each of a plurality of chips including one of transistors, diodes, electronic devices or electromechanical devices formed on the main surface; and a backside ground substrate region located between the depth below the first main surface and a second surface of the substrate opposite to the first surface.

In Example 20, the subject matter of Example 19 can optionally include wherein further comprising a foil glued to the top surface of the wafer that holds the chips in place around the trench structures and above the backside ground substrate region.

In Example 21, the subject matter of Example 19 can optionally include wherein the lateral dicing pattern of trench structures comprises a plurality of closed continuous loops that laterally enclose the plurality of chips of the wafer; and wherein the lateral dicing pattern of trench structure is laterally disposed between seal rings of adjacent chips of the semiconductor wafer.

In Example 22, the subject matter of Example 19 can optionally include wherein the trench structures comprise at least one of: a curved trench section; an intersection between two or more trench sections wherein at least one of the trench sections ends at the intersection; and an intersection between two or more trench sections wherein at least one of the trench sections extends in a different direction on the two sides of the intersection.

In Example 23, the subject matter of Example 19 can optionally include wherein the depth below the first main surface is between a few tens of micrometers up to a few hundreds of micrometers ("um"); and etching the MSK structures produces the trench structures having a width of between 1 um and 10 um.

Consequently, the descriptions herein include embodiments for dicing a semiconductor wafer into chips by (and structures that may result from) forming a lateral chip dicing pattern of vertical metallization layer, via layer, and TSV structures (e.g., MSK structures 150) from a depth below an upper surface of a substrate of a wafer, up through metallization layers of the wafer, to a top surface of the wafer. This dicing pattern may define the perimeters/edges of the chips to be diced from the wafer. A protective layer can be etched away to form a pattern of openings over and to the pattern of MSK structures. Then, a wet etch through the etched protective layer removes the vertical height of the MSK along the chip dicing pattern, and forms lateral chip dicing trench pattern to the depth below the upper surface of the substrate along the intended lateral dicing pattern. Additional etching of the protective layer can form openings to contact pads. Then, a lower surface of the substrate of the wafer can be ground to expose the bottom of the trench pattern and dice the chips.

The above description of illustrated implementations, including what is described in the Abstract, is not intended to be exhaustive or to limit embodiments of the invention to the precise forms disclosed. While specific implementations of, and examples for, the embodiments of the invention are described herein for illustrative purposes, various equivalent modifications are possible within the scope, as those skilled in the relevant art will recognize. These modifications may be made to embodiments of the invention in light of the above detailed description. For example, although some embodiments described above show wet etching of structures 150 between two chips 120a-b; and backside grinding of surface 214 to separate those chips, those descriptions can apply to wet etching of structures 150 between one chip 120a and a horizontal area (e.g., from a top perspective) on the other side of pattern 134 that is not a chip or that is a non-chip structure (e.g., such as an area with no electrical devices, or with non-chip devices, or with optical devices, or that has chip package features). The terms used in the following claims should not be construed to limit the invention to the specific implementations disclosed in the specification and the claims. Rather, the scope is to be determined entirely by the following claims, which are to be construed in accordance with established doctrines of claim interpretation.

The invention claimed is:

1. A method of dicing a semiconductor wafer, the method comprising:
    forming vertically stacked metal stack kerf (MSK) structures comprising a plurality of alternating metal layers and via layers in an intended lateral chip dicing pattern; wherein forming includes forming from a depth below an upper surface of a substrate of the wafer, wherein the depth below the upper surface of the substrate of the wafer is 10 µm or greater, up through metalization layers disposed over the upper surface of the wafer, to a final passivation layer on a top surface of the wafer;
    etching the final passivation layer to expose the vertically stacked metal stack kerf (MSK) structures along the intended lateral chip dicing pattern;
    wet etching the vertically stacked metal stack kerf (MSK) structures along the intended lateral chip dicing pattern to form a lateral chip dicing trench pattern to the depth below the upper surface of the substrate along the intended lateral dicing pattern; and
    backside grinding a lower surface of the substrate to expose the depth below the upper surface of the substrate along the intended lateral dicing pattern.

2. The method of claim 1, wherein backside grinding dices the semiconductor wafer into a plurality of adjacent chips.

3. The method of claim 1, wherein grinding includes physically grinding away material of the substrate from the bottom main surface to the first surface to expose a bottom of the trench structure, and to singulate the plurality of transistor chips of the wafer.

4. The method of claim 1, wherein the lateral dicing pattern of the metal stack kerf (MSK) structure is laterally disposed between seal rings of adjacent chips of the semiconductor wafer.

5. The method of claim 1, wherein etching the final passivation layer comprises:
    forming a first photoresist layer on the final passivation layer;
    performing a photolithographic process to selectively remove the first photoresist layer at locations that are substantially aligned to the lateral dicing pattern of the metal stack kerf (MSK) structure;
    etching the final passivation layer at the locations that are substantially aligned to the lateral dicing pattern of the metal stack kerf (MSK) structures due to the photolithographic process; and
    removing any remaining locations of the first photoresist layer to expose the un-etched final passivation layer.

6. The method of claim 1, wherein etching the final passivation layer comprises a dry plasma etching of the final passivation layer through the location that is substantially aligned to the lateral dicing pattern of the metal stack kerf (MSK) structures.

7. The method of claim 1, wherein the depth below the first main surface is between a-few tens of micrometers up to a few hundreds of micrometers ("um") and wherein etching the metal stack kerf (MSK) structures produces the trench structures having a width of between 1 um and 10 um.

8. The method of claim 1, wherein wet etching the metal stack kerf (MSK) structures comprises chemically wet etching through the opening in the final passivation layer obtained to expose the depth below the first main surface of the substrate at the lateral dicing pattern to obtain the trench pattern.

9. The method of claim 8, wherein the wet etch is a calibrated mixture of parts of hydrogen peroxide, sulfuric acid, and water at a selected temperature.

10. A method of dicing a semiconductor wafer, the method comprising:
forming a lateral dicing pattern of metal stack kerf (MSK) structures comprising a plurality of alternating metal layers and via layers to a depth below a first main surface of a wafer substrate of the wafer, wherein the depth below the first main surface of the wafer substrate is 10 µm or greater, the lateral dicing pattern laterally between and separating each of a plurality of transistor chips formed on the main surface;
forming a final passivation layer over the MSK structures and a top surface of the wafer;
etching the final passivation layer to expose the lateral dicing pattern of the MSK structure;
wet etching the lateral dicing pattern of the metal stack kerf (MSK) structures through the etched final passivation layer to form a trench structure in the substrate that extends to the depth below the first main surface of a substrate; and
grinding a bottom main surface of the substrate opposite to the first main surface with a grinder to remove a thickness of the wafer below and expose the depth below the first main surface of the substrate.

11. The method of claim 10, wherein grinding includes physically grinding away material of the substrate from the bottom main surface to the first surface to expose a bottom of the trench structure, and to singulate the plurality of transistor chips of the wafer.

12. The method of claim 10, wherein etching the final passivation layer comprises a dry plasma etching of the final passivation layer through the location that is substantially aligned to the lateral dicing pattern of the metal stack kerf (MSK) structure.

13. The method of claim 12, wherein etching the final passivation layer comprises:
forming a first photoresist layer on the final passivation layer;
performing a photolithographic process to selectively remove the first photoresist layer at locations that are substantially aligned to the lateral dicing pattern of the metal stack kerf (MSK) structure;
etching the final passivation layer at the locations that are substantially aligned to the lateral dicing pattern of the metal stack kerf (MSK) structures due to the photolithographic process; and
removing any remaining locations of the first photoresist layer to expose the un-etched final passivation layer.

14. The method of claim 10, further comprising:
prior to grinding, forming a second photoresist layer on the final passivation layer and a top thickness of the trench structure;
performing a photolithographic process to selectively remove the second photoresist layer at contact locations that are substantially aligned to contact pads disposed under the final passivation layer;
etching the final passivation layer at the contact locations due to the photolithographic process; and
removing any remaining locations of the second photoresist layer to expose the un-etched final passivation layer and the trench structure.

15. The method of claim 10, wherein forming the lateral dicing pattern of metal stack kerf (MSK) structures comprises forming a plurality of loops that laterally enclose the plurality of transistor chips of the wafer; and
wherein the lateral dicing pattern of the metal stack kerf (MSK) structure is laterally disposed between seal rings of adjacent chips of the semiconductor wafer.

16. The method of claim 10, wherein the depth below the first main surface is between a few tens of micrometers up to a few hundreds of micrometers ("um"); and etching the metal stack kerf (MSK) structures produces the trench structures having a width of between 1 um and 10 um.

17. The method of claim 10, wherein wet etching the metal stack kerf (MSK) structures comprises chemically wet etching the through the opening in the final passivation layer obtained to expose the depth below the first main surface of the substrate at the lateral dicing pattern to obtain the trench structure.

18. The method of claim 17, wherein the wet etch is based on at least one of hydrogen peroxide, sulfuric acid, or de-ionized water.

\* \* \* \* \*